US012635395B2

(12) United States Patent
Pedder et al.

(10) Patent No.: US 12,635,395 B2
(45) Date of Patent: *May 19, 2026

(54) HYBRID DISPLAYS

(71) Applicant: Apple Inc., Cupertino, CA (US)

(72) Inventors: James E Pedder, Oxon (GB); Patrick B Bennett, San Leandro, CA (US); Michael Slootsky, Santa Clara, CA (US); Graham B Myhre, Campbell, CA (US); Andrew Lin, San Jose, CA (US); Cheuk Chi Lo, Belmont, CA (US); Guanjun Tan, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 436 days.

This patent is subject to a terminal disclaimer.

(21) Appl. No.: 18/329,388

(22) Filed: Jun. 5, 2023

(65) Prior Publication Data

US 2024/0081134 A1 Mar. 7, 2024

Related U.S. Application Data

(60) Provisional application No. 63/403,575, filed on Sep. 2, 2022.

(51) Int. Cl.
*H10K 59/90* (2026.01)
*H10K 59/12* (2023.01)
(Continued)

(52) U.S. Cl.
CPC ......... *H10K 59/90* (2023.02); *H10K 59/1201* (2023.02); *H10K 59/127* (2023.02); *H10W 90/00* (2026.01)

(58) Field of Classification Search
CPC .. H10K 59/90; H10K 59/1201; H10K 59/127; H10K 2102/3031; H10K 59/8791;
(Continued)

(56) References Cited

U.S. PATENT DOCUMENTS

| | | |
|---|---|---|
| 7,495,638 B2 | 2/2009 | Lamvik et al. |
| 9,711,114 B1 | 7/2017 | Konttori et al. |
| | (Continued) | |

FOREIGN PATENT DOCUMENTS

| | | |
|---|---|---|
| KR | 20110075846 A | 7/2011 |
| WO | 2023101797 A2 | 6/2023 |

OTHER PUBLICATIONS

Karl Guttag, Varjo Foveated Display and Passthrough AR at AWE 2018, www.kguttag.com, Nov. 6, 2018, pp. 1-7, KGOn Tech.
(Continued)

*Primary Examiner* — Elmito Breval
(74) *Attorney, Agent, or Firm* — Treyz Law Group, P.C.; Joseph F. Guihan; Jinie M. Guihan

(57) ABSTRACT

A hybrid display may include different display portions with different resolutions. The high resolution display portion may be positioned in a main viewing area for the viewer whereas the low resolution display portion may be positioned in a peripheral viewing area. The high resolution display portion may have a silicon backplane. The low resolution display portion may have a different type of backplane such as a thin-film transistor backplane. The different display portions may optionally share a common organic light-emitting diode layer such that light is emitted from the same plane across both display portions. The high resolution display portion may emit light through a transparent window in the low resolution display portion. A high resolution display may also be formed by separately forming a frontplane and a backplane. Conductive attachment structures such as indium bumps may be used to mechanically and electrically connect the backplane to the frontplane.

20 Claims, 19 Drawing Sheets

(51) Int. Cl.
    *H10K 59/127*     (2023.01)
    *H10W 90/00*     (2026.01)

(58) Field of Classification Search
    CPC . H01L 25/0753; H01L 25/167; H10H 20/855;
                                        H10H 20/856
    See application file for complete search history.

(56)               References Cited

U.S. PATENT DOCUMENTS

| | | |
|---|---|---|
| 9,915,824 B2 | 3/2018 | Schowengerdt et al. |
| 10,140,695 B2 | 11/2018 | Wilson et al. |
| 11,349,052 B2 | 5/2022 | Morris et al. |
| 2006/0231842 A1* | 10/2006 | Hirakata ............. H10K 59/351 |
| | | 257/72 |
| 2016/0351539 A1* | 12/2016 | Bower ............... H01L 25/0655 |
| 2017/0038641 A1 | 2/2017 | Yamazaki |
| 2017/0084671 A1 | 3/2017 | Hack et al. |
| 2017/0285343 A1 | 10/2017 | Belenkii et al. |
| 2018/0269266 A1 | 9/2018 | Cancel Olmo et al. |
| 2020/0073618 A1* | 3/2020 | Huang .................. G06F 3/1438 |
| 2021/0335831 A1 | 10/2021 | Matsusaki et al. |
| 2021/0359272 A1 | 11/2021 | Li et al. |
| 2022/0254974 A1 | 8/2022 | Morris et al. |

OTHER PUBLICATIONS

Gijong Lee, Samsung Display and LG Display developing OLEDoS and LEDoS techs, The Elec, Korea Electronics Industry Media, Aug. 8, 2022, Retrieved from: <https://www.thelec.net/news/articleView.html?idxno=4152>.

\* cited by examiner

HYBRID DISPLAYS

This application claims priority to U.S. provisional patent application No. 63/403,575, filed Sep. 2, 2022, which is hereby incorporated by reference herein in its entirety.

BACKGROUND

This relates generally to electronic devices and, more particularly, to electronic devices with displays.

Electronic devices often include displays to present images to a user. Conventional display technologies include organic light-emitting diode (OLED) displays and liquid crystal displays (LCDs). The displays include arrays of display pixels that emit light. Conventional displays may have a lower resolution, lower size, and/or higher cost than desired.

SUMMARY

An electronic device may have a display that displays content for a user. The electronic device may be a head-mounted device with head-mounted support structures that support the display on the head of the user. The head-mounted device may also include a lens module through which the display is viewable.

The display may be a hybrid display. The hybrid display may include different display portions with different resolutions. The high resolution display portion may be positioned in a main viewing area for the viewer whereas the low resolution display portion may be positioned in a peripheral viewing area for the viewer. This is a low cost way to increase the field-of-view of the display.

The high resolution display portion may have a silicon backplane. The low resolution display portion may have a different type of backplane such as a thin-film transistor backplane. The different display portions may optionally share a common organic light-emitting diode (OLED) layer such that light is emitted from the same plane across both display portions. The low resolution display portion may be a bottom-emission OLED display portion or a top-emission OLED display portion. When the low resolution display portion is a top-emission OLED display portion, vias may be included that electrically connect a silicon substrate for the high resolution display portion to the common OLED layer.

In other possible arrangements, the high resolution display portion and the low resolution display portion may not share a common OLED layer. The high resolution display portion may emit light through a transparent window in the low resolution display portion. The low resolution display portion may include pixel control circuits that are formed separately from or integrated with the silicon substrate for the high resolution display portion.

A high resolution display may also be formed by separately forming a frontplane and a backplane. The frontplane may include OLED pixels on a substrate. The backplane may include a silicon substrate with circuitry for controlling the OLED pixels. Conductive attachment structures such as indium bumps may be used to mechanically and electrically connect the backplane to the frontplane.

DETAILED DESCRIPTION

Electronic devices may include displays and other components for presenting content to users. The electronic devices may be wearable electronic devices. A wearable electronic device such as a head-mounted device may have head-mounted support structures that allow the head-mounted device to be worn on a user's head.

A head-mounted device may contain a display formed from one or more display panels (displays) for displaying visual content to a user. A lens system may be used to allow the user to focus on the display and view the visual content. The lens system may have a left lens module that is aligned with a user's left eye and a right lens module that is aligned with a user's right eye.

Figure 1:
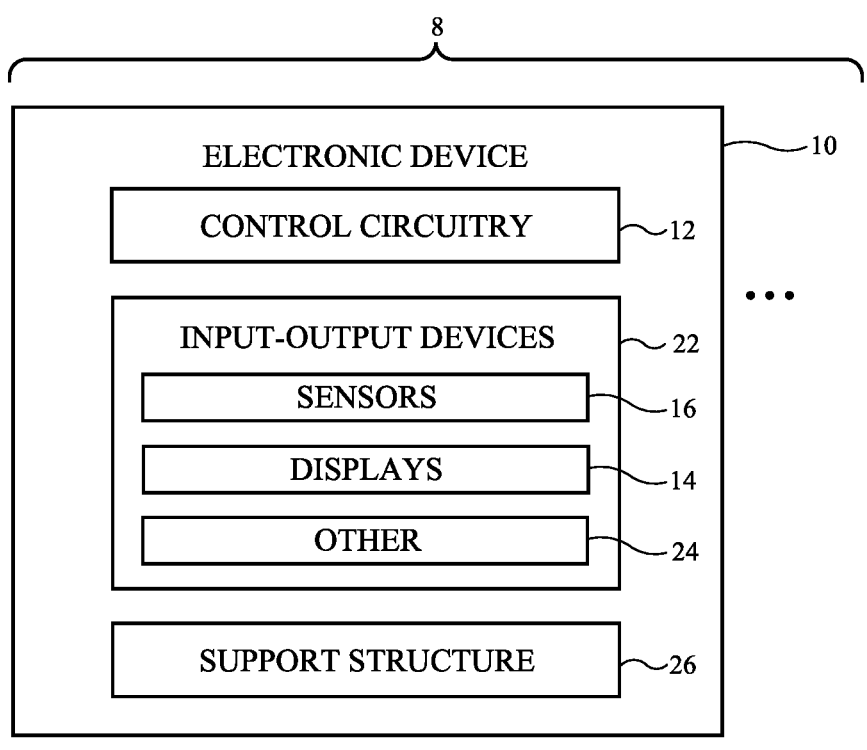
FIG. 1 is a schematic diagram of an illustrative electronic device such as a head-mounted display device in accordance with some embodiments.

A schematic diagram of an illustrative system having an electronic device with a lens module is shown in FIG. 1. As shown in FIG. 1, system 8 may include one or more electronic devices such as electronic device 10. The electronic devices of system 8 may include computers, cellular telephones, head-mounted devices, wristwatch devices, and other electronic devices. Configurations in which electronic device 10 is a head-mounted device are sometimes described herein as an example.

As shown in FIG. 1, electronic devices such as electronic device 10 may have control circuitry 12. Control circuitry 12 may include storage and processing circuitry for controlling the operation of device 10. Circuitry 12 may include storage such as hard disk drive storage, nonvolatile memory (e.g., electrically-programmable-read-only memory configured to form a solid-state drive), volatile memory (e.g., static or dynamic random-access-memory), etc. Processing circuitry in control circuitry 12 may be based on one or more microprocessors, microcontrollers, digital signal processors, baseband processors, power management units, audio chips, graphics processing units, application specific integrated circuits, and other integrated circuits. Software code may be stored on storage in circuitry 12 and run on processing circuitry in circuitry 12 to implement control operations for device 10 (e.g., data gathering operations, operations involved in processing three-dimensional facial image data, operations involving the adjustment of components using control signals, etc.). Control circuitry 12 may include wired and wireless communications circuitry. For example, control circuitry 12 may include radio-frequency transceiver circuitry such as cellular telephone transceiver circuitry, wireless local area network (WiFi®) transceiver circuitry, millimeter wave transceiver circuitry, and/or other wireless communications circuitry.

During operation, the communications circuitry of the devices in system 8 (e.g., the communications circuitry of control circuitry 12 of device 10), may be used to support communication between the electronic devices. For example, one electronic device may transmit video and/or audio data to another electronic device in system 8. Electronic devices in system 8 may use wired and/or wireless communications circuitry to communicate through one or more communications networks (e.g., the internet, local area networks, etc.). The communications circuitry may be used to allow data to be received by device 10 from external equipment (e.g., a tethered computer, a portable device such as a handheld device or laptop computer, online computing equipment such as a remote server or other remote computing equipment, or other electrical equipment) and/or to provide data to external equipment.

Device 10 may include input-output devices 22. Input-output devices 22 may be used to allow a user to provide device 10 with user input. Input-output devices 22 may also be used to gather information on the environment in which device 10 is operating. Output components in devices 22 may allow device 10 to provide a user with output and may be used to communicate with external electrical equipment.

As shown in FIG. 1, input-output devices 22 may include one or more displays such as display 14. In some configurations, display 14 of device 10 includes left and right display panels (sometimes referred to as left and right portions of display 14 and/or left and right displays) that are in alignment with the user's left and right eyes, respectively. In other configurations, display 14 includes a single display panel that extends across both eyes. The example of device 10 including a display is merely illustrative and display(s) 14 may be omitted from device 10 if desired. Device 10 may include an optical pass-through area where real-world content is viewable to the user either directly or through a tunable lens.

Display 14 may be used to display images. The visual content that is displayed on display 14 may be viewed by a user of device 10. Displays in device 10 such as display 14 may be organic light-emitting diode displays or other displays based on arrays of light-emitting diodes, liquid crystal displays, liquid-crystal-on-silicon displays, projectors or displays based on projecting light beams on a surface directly or indirectly through specialized optics (e.g., digital micromirror devices), electrophoretic displays, plasma displays, electrowetting displays, or any other suitable displays.

Input-output circuitry 22 may include sensors 16. Sensors 16 may include, for example, three-dimensional sensors (e.g., three-dimensional image sensors such as structured light sensors that emit beams of light and that use two-dimensional digital image sensors to gather image data for three-dimensional images from light spots that are produced when a target is illuminated by the beams of light, binocular three-dimensional image sensors that gather three-dimensional images using two or more cameras in a binocular imaging arrangement, three-dimensional lidar (light detection and ranging) sensors, three-dimensional radio-frequency sensors, or other sensors that gather three-dimensional image data), cameras (e.g., infrared and/or visible digital image sensors), gaze tracking sensors (e.g., a gaze tracking system based on an image sensor and, if desired, a light source that emits one or more beams of light that are tracked using the image sensor after reflecting from a user's eyes), touch sensors, buttons, force sensors, sensors such as contact sensors based on switches, gas sensors, pressure sensors, moisture sensors, magnetic sensors, audio sensors (microphones), ambient light sensors, microphones for gathering voice commands and other audio input, sensors that are configured to gather information on motion, position, and/or orientation (e.g., accelerometers, gyroscopes, compasses, and/or inertial measurement units that include all of these sensors or a subset of one or two of these sensors), fingerprint sensors and other biometric sensors, optical position sensors (optical encoders), and/or other position sensors such as linear position sensors, and/or other sensors. Sensors 16 may include proximity sensors (e.g., capacitive proximity sensors, light-based (optical) proximity sensors, ultrasonic proximity sensors, and/or other proximity sensors). Proximity sensors may, for example, be used to sense relative positions between a user's nose and lens modules in device 10.

User input and other information may be gathered using sensors and other input devices in input-output devices 22. If desired, input-output devices 22 may include other devices 24 such as haptic output devices (e.g., vibrating components), light-emitting diodes and other light sources, speakers such as ear speakers for producing audio output, and other electrical components. Device 10 may include circuits for receiving wireless power, circuits for transmitting power wirelessly to other devices, batteries and other energy storage devices (e.g., capacitors), joysticks, buttons, and/or other components.

Electronic device 10 may have housing structures (e.g., housing walls, straps, etc.), as shown by illustrative support structures 26 of FIG. 1. In configurations in which electronic device 10 is a head-mounted device (e.g., a pair of glasses, goggles, a helmet, a hat, etc.), support structures 26 may include head-mounted support structures (e.g., a helmet housing, head straps, temples in a pair of eyeglasses, goggle housing structures, and/or other head-mounted structures). The head-mounted support structures may be configured to be worn on a head of a user during operation of device 10 and may support display(s) 14, sensors 16, other components 24, other input-output devices 22, and control circuitry 12. The example in FIG. 1 of electronic device 10 being a head-mounted device is merely illustrative. If desired, electronic device 10 may be another type of electronic device such as a cellular telephone, laptop computer, watch, tablet computer, etc.

Figure 2:
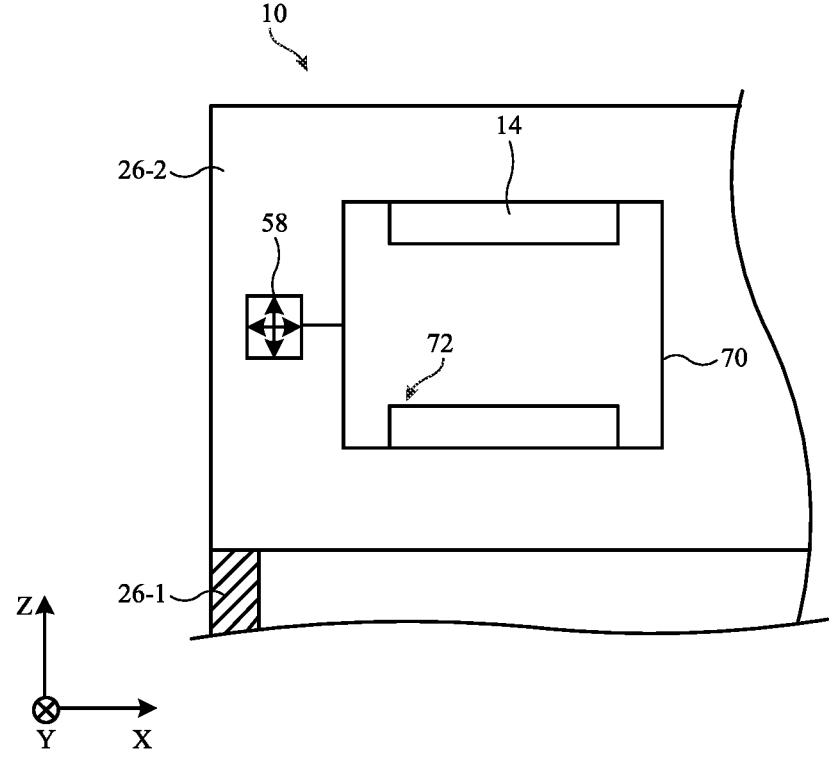
FIG. 2 is a top view of an illustrative head-mounted device in accordance with some embodiments.

FIG. 2 is a top view of electronic device 10 in an illustrative configuration in which electronic device 10 is a head-mounted device. As shown in FIG. 2, electronic device 10 may include support structures (see, e.g., support structures 26 of FIG. 1) that are used in housing the components of device 10 and mounting device 10 onto a user's head. These support structures may include, for example, structures that form housing walls and other structures for main unit 26-2 (e.g., exterior housing walls, lens module structures, etc.) and straps or other supplemental support structures such as structures 26-1 that help to hold main unit 26-2 on a user's face.

Display 14 may include left and right display panels (e.g., left and right pixel arrays, sometimes referred to as left and right displays or left and right display portions) that are mounted respectively in left and right display modules 70 corresponding respectively to a user's left eye and right eye. A display module corresponding the user's left eye is shown in FIG. 2.

Each display module 70 includes a display portion 14 and a corresponding lens module 72 (sometimes referred to as lens stack-up 72, lens 72, or adjustable lens 72). Lens 72 may include one or more lens elements arranged along a common axis. Each lens element may have any desired shape and may be formed from any desired material (e.g., with any desired refractive index). The lens elements may have unique shapes and refractive indices that, in combination, focus light from display 14 in a desired manner. Each lens element of lens module 72 may be formed from any desired material (e.g., glass, a polymer material such as polycarbonate or acrylic, a crystal such as sapphire, etc.).

Modules 70 may optionally be individually positioned relative to the user's eyes and relative to some of the housing wall structures of main unit 26-2 using positioning circuitry such as positioner 58. Positioner 58 may include stepper motors, piezoelectric actuators, motors, linear electromagnetic actuators, and/or other electronic components for adjusting the position of displays 14 and lens modules 72. Positioners 58 may be controlled by control circuitry 12 during operation of device 10. For example, positioners 58 may be used to adjust the spacing between modules 70 (and therefore the lens-to-lens spacing between the left and right lenses of modules 70) to match the interpupillary distance IPD of a user's eyes.

In some cases, the distance between lens module 72 and display 14 is variable. For example, the distance between the lens module and the display any be adjusted to account for the eyesight of a particular user. In another example, the lens module may include an adjustable lens element. The curvature of the adjustable lens element may be adjusted in real time to compensate for a user's eyesight, as one example.

To improve the user experience during operations of electronic device 10, it may be desirable for the field-of-view of display 14 to be large. One method of increasing the field-of-view of the display is to increase the size of the display. However, increasing the size of the display may increase the cost/complexity of the display. Additionally, manufacturing requirements may limit the maximum feasible size of the display in certain applications. To increase the field-of-view of the display while minimizing the cost and bulkiness of the electronic device, hybrid displays may be used. Hybrid displays may include pixels of different pixel types (e.g., some OLED pixels and some LCD pixels), display portions with different backplane types, display portions with different resolutions and/or display portions with other desired differences.

Any given display (or display portion) has a pixel type and a backplane type. Examples of pixel types include organic light-emitting diode (OLED) pixels, liquid crystal display (LCD) pixels, or pixels formed from discrete inorganic light-emitting diodes (sometimes referred to as microLEDs or microLED pixels). Herein, the term frontplane may be used to refer to the actual display pixels and the type of technology used to form the display pixels. In contrast, the term backplane may be used to refer to the control circuitry that is used to control the display pixels. Examples of backplane types include silicon backplanes and thin-film transistor (TFT) backplanes.

In general, displays such as organic light-emitting diode (OLED) displays may include pixels formed on a substrate. The substrate may be formed from glass layers, polymer layers, silicon layers, composite films that include polymer and inorganic materials, metallic foils, etc. In one example, the display substrate may be formed from silicon. The silicon substrate may include circuitry (transistors) that is used to operate pixels in the display. Using silicon as the material for the substrate may allow for the display to have a higher resolution and/or greater processing capabilities than if a different material such as glass or plastic is used for substrate. Displays with silicon substrates that include circuitry to operate the pixels may be referred to as having a silicon backplane. The silicon backplane may enable high resolution such as resolution greater than 2500 pixels per inch (PPI). However, manufacturing constraints may result in limitations in the size of display with a silicon backplane (e.g., a maximum dimension of 1.5 inches).

In another possible OLED display arrangement, thin-film transistor circuitry that is used to operate display pixels is formed on a glass substrate. The thin-film transistor (TFT) circuitry may include thin-film transistors (TFTs) formed using semiconductors such as silicon or semiconducting oxides. Displays of this type may be referred to as having a TFT backplane. Displays with TFT backplanes may be less expensive than displays with silicon backplanes and may have much larger (or no) size constraints (unlike the displays with silicon backplanes). However, the maximum resolution of displays with TFT backplanes (at reasonable costs) may be lower than displays with silicon backplanes. For example, the displays with TFT backplanes on a glass substrate may have a maximum resolution of 1000 PPI.

Herein, hybrid displays may use display portions of multiple types (e.g., a portion with a silicon backplane and a portion with a TFT backplane) to have a single unitary display that benefits from the advantages of multiple display types.

Figure 3:
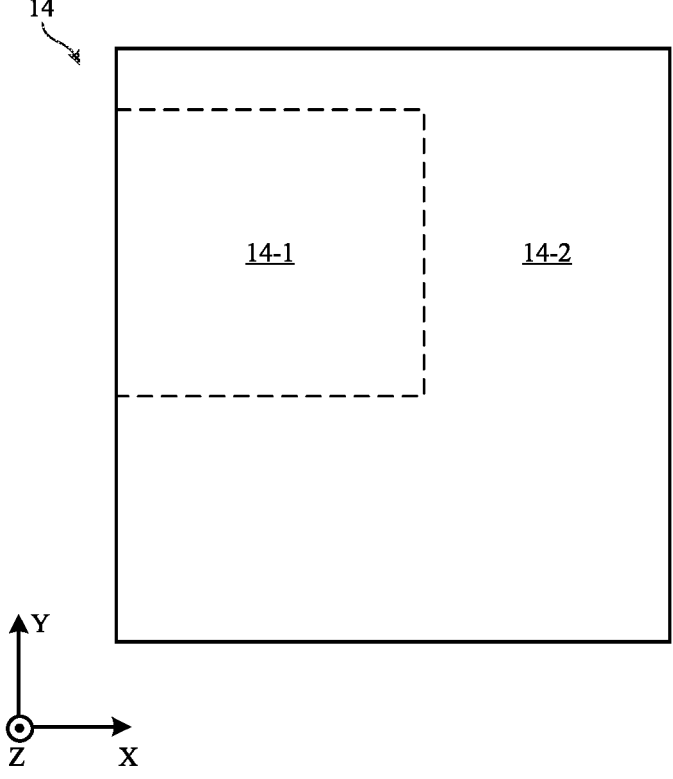
FIG. 3 is a top view of an illustrative hybrid display with a first display portion having a first resolution and a second display portion having a second resolution that is different than the first resolution in accordance with some embodiments.

FIG. 3 is a top view of an illustrative hybrid display. As shown in FIG. 3, display 14 includes a first display portion 14-1 and a second display portion 14-2. The first display portion 14-1 may have a higher resolution than display portion 14-2, may be formed using a different display technology than display portion 14-2, and or may use a different backplane type than display portion 14-2. For example, display portion 14-1 may be an organic light-emitting diode display with a silicon backplane and a first resolution whereas display portion 14-2 may be an organic light-emitting diode display with a TFT backplane and a second resolution that is lower than the first resolution.

In a head-mounted device, it may be desirable to use a display with a silicon backplane in order to achieve the high resolution enabled by that arrangement. However, the size constraints of displays of this type may limit the field-of-view of the display. In the display of FIG. 3, display portion 14-1 may have a silicon backplane. Portion 14-1 may be, for example, as large as possible given the cost/manufacturing constraints for device 10. This ensures that as large an area as possible has a high resolution (e.g., 3000 PPI) enabled by the silicon backplane portion of the display.

The remaining portion of the display (display portion 14-2) may have a lower resolution (e.g., 500 PPI) than display portion 14-1. However, including the additional display portion 14-2 increases the overall size of the display at relatively low cost, which correspondingly increases the field-of-view of the display.

This high resolution portion of the display (14-1) may be positioned in a main viewing area of the display (e.g., where the user will normally be focusing their gaze during operation of device 10). The human eye distinguishes higher resolution in the center of its point of gaze than in its periphery. Positioning the high resolution portion 14-1 in the main viewing area of the display and the low resolution portion 14-2 in the peripheral viewing area of the display ensures that the lower resolution in portion 14-2 has a minimal adverse impact on the user's viewing experience. When the user looks at portion 14-1 of the display, they will see the higher resolution pixels. In the periphery of their vision, the lower resolution display portion 14-2 will also be visible (therefore achieving the desired increased field-of-view). Additionally, the user's peripheral vision is not strong enough to notice the lower resolution in this area. In this way, the effective display size may be increased without adversely affecting the viewer experience.

The physical spacing of pixels in display portion 14-1 (e.g., the pixel width and/or center-to-center spacing) is different than the physical spacing of pixels in display portion 14-2. This type of display may be referred to as a hard foveated display (since the different display portions have different and fixed maximum resolutions). Pixels from both display portions 14-1 and 14-2 may be directly viewable when looking in the negative Z-direction. In other words, display portions have complementary footprints that are parallel to the XY-plane in FIG. 3. The footprint of the light-emitting area of display portion 14-1 does not (or has minimal) overlap with the footprint of the light-emitting area of display portion 14-2 in the Z-direction. Likewise, the footprint of the light-emitting area of display portion 14-2 does not (or has minimal) overlap with the footprint of the light-emitting area of display portion 14-1 in the Z-direction.

Figure 4:
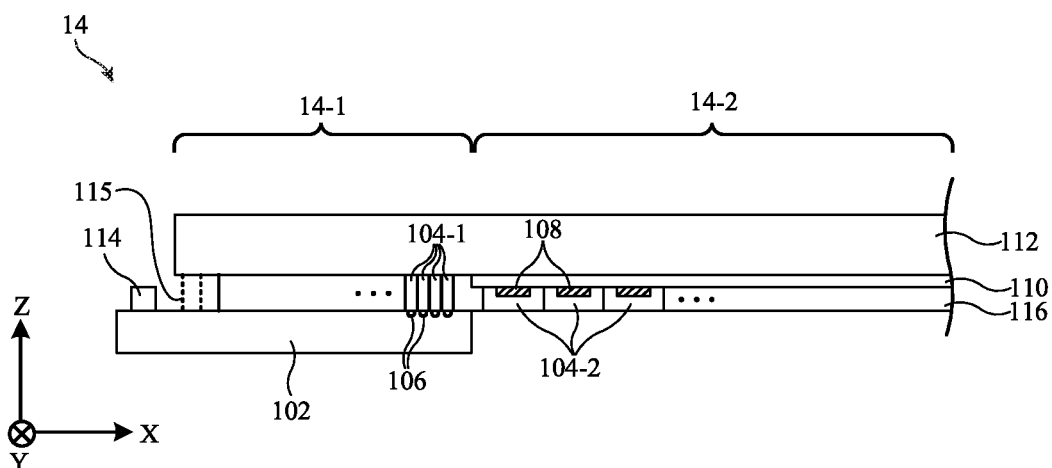
FIG. 4 is a cross-sectional side view of an illustrative hybrid display having a top-emission display portion with a silicon backplane and a bottom-emission display portion with a TFT backplane in accordance with some embodiments.

There are several ways to realize a hybrid display of the type shown in FIG. 3. FIG. 4 is a cross-sectional side view of a hybrid display. As shown in FIG. 4, the hybrid display includes a first display portion 14-1 with a silicon backplane and a second display portion 14-2 with a TFT backplane. One or more common organic light-emitting diode layers 116 are used to form OLED pixels for both display portion 14-1 and display portion 14-2. The OLED layers 116 may include a hole transport layer, a hole injection layer, an emissive layer, an electron transport layer, and an electron injection layer. This example is merely illustrative, and common OLED layer(s) 116 may include any desired number and arrangement of layers.

Display portion 14-1 uses a silicon substrate 102 that includes circuitry for operating first display pixels 104-1. Display portion 14-2 uses a dielectric substrate 112 (e.g., a glass substrate or a plastic substrate). Dielectric substrate 112 may be transparent (e.g., having a transparency greater than 90%, greater than 95%, greater than 99%, etc.). A thin-film transistor layer 110 that includes thin-film transistors is included on substrate 112 and is used to operate display pixels 104-2 for display portion 14-2. Display portion 14-2 is a bottom-emission OLED display where light is emitted through transparent substrate 112 in the positive Z-direction. Display portion 14-1 is a top-emission OLED display where light is emitted away from substrate 102 and through substrate 112 in the positive Z-direction.

Each pixel 104-1 in display portion 14-1 may have a corresponding electrode 106 (e.g., anode 106) that is used to control emission of light from that pixel. Circuitry within silicon substrate 102 selectively applies signals to each electrode 106 to control emission of light across display portion 14-1. A display driver integrated circuit (DDIC) 114 may be mounted on silicon substrate 102 and may provide signals to circuitry within substrate 102 (for controlling pixels 104-1). Each pixel 104-2 in display portion 14-2 may have a corresponding electrode 108 (e.g., anode 108) that is used to control emission of light from that pixel. Thin-film transistor circuitry 110 selectively applies signals to each electrode 108 to control emission of light across display portion 14-2.

A flexible printed circuit may be attached to the edge of silicon substrate 102. The flexible printed circuit may provide signals to DDIC 114 (e.g., from a motherboard in device 10). An additional flexible printed circuit may also be attached to an edge of TFT layer 110 and substrate 112. Display driver circuitry for operating display portion 14-2 may be included at the edge of display portion 14-2 and the additional flexible printed circuit may provide signals to the display driver circuitry.

As shown in FIG. 4, the width and pitch (center-to-center spacing) of each pixel in display portion 14-1 is smaller than in display portion 14-2. The width and pitch of pixels 104-2 may each be greater than in pixels 104-1 by more than 50%, more than 100%, more than 200%, more than 300%, more than 500%, less than 500%, between 300% and 800%, etc. Display portion 14-1 therefore has a higher resolution than display portion 14-2 (as discussed in connection with FIG. 3). The resolution in display portion 14-1 may be greater than the resolution in display portion 14-2 by more than 50%, more than 100%, more than 200%, more than 300%, more than 500%, less than 500%, between 300% and 800%, etc.

One or more components (e.g., opaque components) of TFT layer 110 is omitted from substrate 112 over display portion 14-1. In this way, substrate 112 forms a transparent window that allows light from display portion 14-1 to pass through substrate 112 to a viewer. In the transparent window region of display portion 14-2, one or more components (e.g., thin-film transistors) is omitted that is included in the light-emitting portion of display portion 14-2. Each pixel 104-2 may be controlled by one or more TFTs. These TFTs may be omitted over display portion 14-1 to maximize the transparency over display portion 14-1.

There are several advantages to the arrangement of FIG. 4. Display portion 14-1 may be as large as possible given manufacturing constraints for silicon substrate 102 and its corresponding pixels. The area of the hybrid display with a high resolution is therefore maximized. Display portion 14-2 may have a low cost to manufacture and still provides satisfactory display performance for the periphery of the user's vision. Because display portions 14-1 and 14-2 share common OLED layers 116, there may be no visible seam between display portions 14-1 and 14-2 (when viewed from above in the negative Z-direction). Additionally, because display portions 14-1 and 14-2 share common OLED layers 116, the emissive OLED layer for both display portions 14-1 and 14-2 are in a common plane. This eliminates potential mismatch caused by the light-emitting emissive layers being positioned in different planes.

To manufacture a display of the type shown in FIG. 4, thin-film transistor circuitry 110 and OLED layer(s) 116 may be formed on transparent substrate 112. Electrodes for the pixels may be patterned such that the pixels have a greater size and pitch in portion 14-2 than in portion 14-1. Separately, silicon substrate 102 and associated circuitry may be formed. Silicon substrate 102 may then be attached such that circuitry within substrate 102 operates display pixels 104-1 in portion 14-1.

In the example of FIG. 4, a display driver integrated circuit (DDIC) 114 is mounted to substrate 102 to drive pixels 104-1 for display portion 14-1. If desired, a separate display driver integrated circuit (or other display driver circuitry) may be formed on substrate 112 to drive pixels 104-2 for display portion 14-2. In other words, each display portion may have separate (dedicated) respective driving circuitry. Alternatively, DDIC 114 on substrate 102 may be a shared DDIC that drives both pixels 104-1 in display portion 14-1 and pixels 104-2 in display portion 14-2. In this case, one or more optional interconnects 115 may be used to electrically connect DDIC 114 to substrate 112 (and TFT layer 110 on substrate 112). As yet another alternative, display portion 14-2 may have a dedicated DDIC that is formed separately from DDIC 114 but that is also mounted on substrate 102 (e.g., adjacent to DDIC 114) and electrically connected to display portion 14-2 using interconnect(s)

115. Interconnect 115 may be a conductive interconnect formed by a conductive (e.g., indium) bump, as one example.

In general, in any of the hybrid displays described herein, each display portion may include a respective DDIC or a shared DDIC may drive both display portions. The DDIC for a given display portion may be mounted on the same substrate as the pixels for that display portion (e.g., DDIC 114 driving pixels 104-1 in FIG. 4) or on a different substrate than the pixels for that display portion (e.g., DDIC 114 driving pixels 104-2 in FIG. 4).

Figure 5:
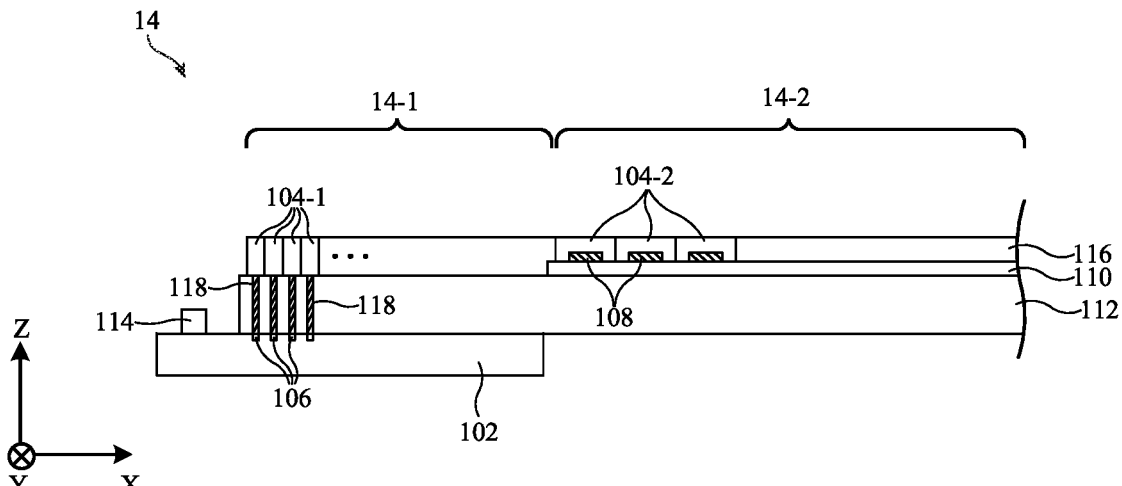
FIG. 5 is a cross-sectional side view of an illustrative hybrid display having a top-emission display portion with a silicon backplane and a top-emission display portion with a TFT backplane in accordance with some embodiments.

FIG. 5 is a cross-sectional side view of a hybrid display with a top-emission display portion 14-1 with a silicon backplane and a top-emission display portion 14-2 with a TFT backplane. Similar to as in FIG. 4, one or more common organic light-emitting diode layers 116 are used to form OLED pixels for both display portion 14-1 and display portion 14-2. The OLED layers 116 may include a hole transport layer, a hole injection layer, an emissive layer, an electron transport layer, and an electron injection layer. This example is merely illustrative, and common OLED layer(s) 116 may include any desired number and arrangement of layers.

Display portion 14-1 uses a silicon substrate 102 that includes circuitry for operating first display pixels 104-1. Display portion 14-2 uses a dielectric substrate 112 (e.g., a glass substrate or a plastic substrate). Dielectric substrate 112 may be transparent (e.g., having a transparency greater than 90%, greater than 95%, greater than 99%, etc.). However, because both display portions are top-emission display portions and substrate 112 is positioned below the pixels, substrate 112 does not necessarily need to be transparent. Substrate 112 may therefore optionally be opaque. A thin-film transistor layer 110 that includes thin-film transistors is included on substrate 112 and is used to operate display pixels 104-2 for display portion 14-2. Display portion 14-2 is a top-emission OLED display portion where light is emitted away from transparent substrate 112 in the positive Z-direction. Display portion 14-1 is a top-emission OLED display portion where light is emitted away from substrates 102 and 112 in the positive Z-direction.

Each pixel 104-1 in display portion 14-1 may have a corresponding electrode 106 (e.g., anode 106) that is used to control emission of light from that pixel. Electrodes 106 may sometimes be referred to as contacts 106. Each contact 106 is electrically connected to a respective via 118 through transparent substrate 112. Vias 118 electrically connect contacts 106 to OLED layers 116. Each via 118 may optionally be electrically connected between a contact 106 and another contact/electrode (anode) that is in direct contact with OLED layers 116. Circuitry within silicon substrate 102 selectively applies signals to each electrode 106 to control emission of light across display portion 14-1. A display driver integrated circuit (DDIC) 114 may be mounted on silicon substrate 102 and may provide signals to circuitry within substrate 102 (for controlling pixels 104-1). Each pixel 104-2 in display portion 14-2 may have a corresponding electrode 108 (e.g., anode 108) that is used to control emission of light from that pixel.

Thin-film transistor circuitry 110 selectively applies signals to each electrode 108 to control emission of light across display portion 14-2.

A flexible printed circuit may be attached to the edge of silicon substrate 102. The flexible printed circuit may provide signals to DDIC 114 (e.g., from a motherboard in device 10). An additional flexible printed circuit may also be attached to an edge of TFT layer 110 and substrate 112.

Display driver circuitry for operating display portion 14-2 may be included at the edge of display portion 14-2 and the additional flexible printed circuit may provide signals to the display driver circuitry.

As shown in FIG. 5, the width and pitch (center-to-center spacing) of each pixel in display portion 14-1 is smaller than in display portion 14-2. The width and pitch of pixels 104-2 may each be greater than in pixels 104-1 by more than 50%, more than 100%, more than 200%, more than 300%, more than 500%, less than 500%, between 300% and 800%, etc. Display portion 14-1 therefore has a higher resolution than display portion 14-2 (as discussed in connection with FIG. 3). The resolution in display portion 14-1 may be greater than the resolution in display portion 14-2 by more than 50%, more than 100%, more than 200%, more than 300%, more than 500%, less than 500%, between 300% and 800%, etc.

There are several advantages to the arrangement of FIG. 5. Display portion 14-1 may be as large as possible given manufacturing constraints for silicon substrate 102 and its corresponding pixels. Display portion 14-2 may have a low cost to manufacture and still provides satisfactory display performance for the periphery of the user's vision. Because display portions 14-1 and 14-2 share common OLED layers 116, there may be no visible seam between display portions 14-1 and 14-2 (when viewed from above in the negative Z-direction). Additionally, because display portions 14-1 and 14-2 share common OLED layers 116, the emissive OLED layer for both display portions 14-1 and 14-2 are in a common plane. This eliminates potential mismatch caused by the light-emitting emissive layers being positioned in different planes.

To manufacture a display of the type shown in FIG. 5, thin-film transistor circuitry 110 and OLED layer(s) 116 may be formed on transparent substrate 112. Vias 118 may also be formed in substrate 112 (e.g., via laser etching). Electrodes for the pixels may be patterned such that the pixels have a greater size and pitch in portion 14-2 than in portion 14-1. Separately, silicon substrate 102 may be formed. Silicon substrate 102 may then be attached to substrate 112 such that contacts 106 are aligned with and electrically connected to respective vias 118 in substrate 112. This allows circuitry within substrate 102 to operate display pixels 104-1 in portion 14-1.

Figure 6:
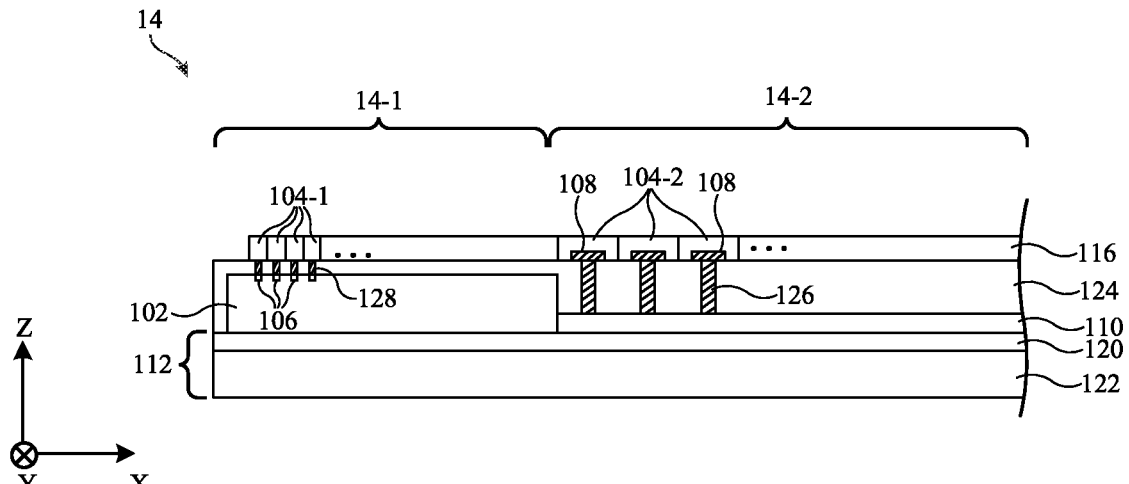
FIG. 6 is a cross-sectional side view of an illustrative hybrid display having a top-emission display portion with a silicon backplane that is embedded in the TFT backplane of an additional top-emission display portion in accordance with some embodiments.

FIG. 6 is a cross-sectional side view of a hybrid display with a top-emission display portion 14-1 with a silicon backplane and a top-emission display portion 14-2 with a TFT backplane. Similar to as in FIG. 5, one or more common organic light-emitting diode layers 116 are used to form OLED pixels for both display portion 14-1 and display portion 14-2. The OLED layers 116 may include a hole transport layer, a hole injection layer, an emissive layer, an electron transport layer, and an electron injection layer. This example is merely illustrative, and common OLED layer(s) 116 may include any desired number and arrangement of layers.

In the arrangement of FIG. 6, the silicon substrate for display portion 14-1 is embedded in the TFT backplane for display portion 14-2. Display portion 14-1 uses a silicon substrate 102 that includes circuitry for operating first display pixels 104-1. Display portion 14-2 uses a dielectric substrate 112. Dielectric substrate 112 may be transparent (e.g., having a transparency greater than 90%, greater than 95%, greater than 99%, etc.). However, because both display portions are top-emission display portions, substrate 112 does not necessarily need to be transparent. Substrate 112 may therefore optionally be opaque. In one possible arrangement, shown in FIG. 6, substrate 112 may include multiple layers such as a polyimide layer 120 that is formed on a glass layer 122. This type of substrate may be used for any of the displays described herein.

A thin-film transistor layer 110 that includes thin-film transistors is included on substrate 112 and is used to operate display pixels 104-2 for display portion 14-2. Display portion 14-2 is a top-emission OLED display portion where light is emitted away from transparent substrate 112 in the positive Z-direction. Display portion 14-1 is a top-emission OLED display portion where light is emitted away from substrates 102 and 112 in the positive Z-direction.

A dielectric layer 124 is formed over TFT layer 110 and silicon substrate 102 in FIG. 6. The dielectric layer 124 may be formed from an organic material. The material for dielectric layer 124 may have a low dielectric constant (e.g., less than 4.0, less than 3.5, less than 3.0, less than 2.8, less than 2.5, etc.). Dielectric layer 124 may conform to the edges of silicon substrate 102. In FIG. 6, the dielectric layer is formed over the upper surface of silicon substrate 102. First vias 128 are formed between contacts 106 in silicon substrate 102 and corresponding pixels 104-1. Second vias 126 are formed between TFT layer 110 and corresponding electrodes 108 (sometimes referred to as anodes 108).

Each pixel 104-1 in display portion 14-1 may have a corresponding electrode 106 (e.g., anode 106) that is used to control emission of light from that pixel. Electrodes 106 may sometimes be referred to as contacts 106. Each contact 106 is electrically connected to a respective via 128 through dielectric layer 124. Vias 128 electrically connect contacts 106 to OLED layers 116. Each via 128 may optionally be electrically connected between a contact 106 and another contact/electrode (anode) that is in direct contact with OLED layers 116. Circuitry within silicon substrate 102 selectively applies signals to each electrode 106 to control emission of light across display portion 14-1. A display driver integrated circuit (DDIC) may be mounted on silicon substrate 102 and may provide signals to circuitry within substrate 102 (for controlling pixels 104-1). Each pixel 104-2 in display portion 14-2 may have a corresponding electrode 108 (e.g., anode 108) and via 126 that are used to control emission of light from that pixel. Thin-film transistor circuitry 110 selectively applies signals to each via 126 to control emission of light across display portion 14-2.

A flexible printed circuit may be attached to the edge of silicon substrate 102. The flexible printed circuit may provide signals to DDIC 114 (e.g., from a motherboard in device 10). An additional flexible printed circuit may also be attached to an edge of TFT layer 110 and substrate 112. Display driver circuitry for operating display portion 14-2 may be included at the edge of display portion 14-2 and the additional flexible printed circuit may provide signals to the display driver circuitry.

As shown in FIG. 6, the width and pitch (center-to-center spacing) of each pixel in display portion 14-1 is smaller than in display portion 14-2. The width and pitch of pixels 104-2 may each be greater than in pixels 104-1 by more than 50%, more than 100%, more than 200%, more than 300%, more than 500%, less than 500%, between 300% and 800%, etc. Display portion 14-1 therefore has a higher resolution than display portion 14-2 (as discussed in connection with FIG. 3). The resolution in display portion 14-1 may be greater than the resolution in display portion 14-2 by more than 50%, more than 100%, more than 200%, more than 300%, more than 500%, less than 500%, between 300% and 800%, etc.

There are several advantages to the arrangement of FIG. 6. Display portion 14-1 may be as large as possible given manufacturing constraints for silicon substrate 102 and its corresponding pixels. Display portion 14-2 may have a low cost to manufacture and still provides satisfactory display performance for the periphery of the user's vision. Because display portions 14-1 and 14-2 share common OLED layers 116, there may be no visible seam between display portions 14-1 and 14-2 (when viewed from above in the negative Z-direction). Additionally, because display portions 14-1 and 14-2 share common OLED layers 116, the emissive OLED layer for both display portions 14-1 and 14-2 are in a common plane. This eliminates potential mismatch caused by the light-emitting emissive layers being positioned in different planes.

To manufacture a display of the type shown in FIG. 6, thin-film transistor circuitry 110 may be formed on substrate 112. Silicon substrate 102 may also be mounted on substrate 112. A conformal dielectric layer 124 is then formed over the silicon substrate 102 and TFT layer 110. Vias 128 and 126 may then be formed in the dielectric layer 124. The common OLED layers 116 are then formed over dielectric layer 124.

In FIGS. 5 and 6, display portion 14-2 is a top-emission display portion. This may have a higher aperture ratio than the bottom-emission display portion 14-2 of FIG. 4.

Figure 7:
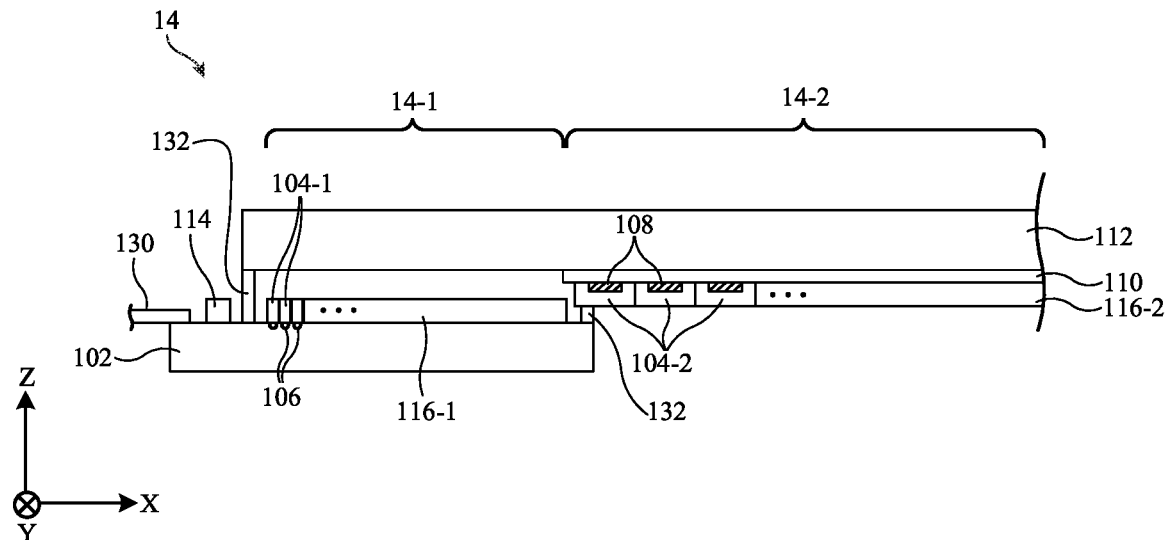
FIG. 7 is a cross-sectional side view of an illustrative hybrid display having a top-emission display portion with a silicon backplane and a display portion with a TFT backplane and with a separately formed OLED layer in accordance with some embodiments.

In FIGS. 4-6, display portions 14-1 and 14-2 share common OLED layers 116. This example is merely illustrative. FIG. 7 is a cross-sectional side view of an illustrative hybrid display where the first and second display portions have separate respective OLED layers. As shown in FIG. 7, the hybrid display includes a first display portion 14-1 with a silicon backplane and a second display portion 14-2 with a TFT backplane. Each display portion may include respective organic light-emitting diode layers. Display portion 14-1 includes OLED layers 116-1 whereas display portion 14-2 includes OLED layers 116-2. Each set of OLED layers may include a hole transport layer, a hole injection layer, an emissive layer, an electron transport layer, and an electron injection layer. This example is merely illustrative, and the OLED layer(s) may include any desired number and arrangement of layers.

Display portion 14-1 uses a silicon substrate 102 that includes circuitry for operating first display pixels 104-1. Display portion 14-2 uses a dielectric substrate 112 (e.g., a glass substrate or a plastic substrate). Dielectric substrate 112 may be transparent (e.g., having a transparency greater than 90%, greater than 95%, greater than 99%, etc.). A thin-film transistor layer 110 that includes thin-film transistors is included on substrate 112 and is used to operate display pixels 104-2 for display portion 14-2. Display portion 14-2 is a bottom-emission OLED display where light is emitted through transparent substrate 112 in the positive Z-direction. Display portion 14-1 is a top-emission OLED display where light is emitted away from substrate 102 and through substrate 112 in the positive Z-direction.

Each pixel 104-1 in display portion 14-1 may have a corresponding electrode 106 (e.g., anode 106) that is used to control emission of light from that pixel. Circuitry within silicon substrate 102 selectively applies signals to each electrode 106 to control emission of light across display portion 14-1. A display driver integrated circuit (DDIC) 114 may be mounted on silicon substrate 102 and may provide signals to circuitry within substrate 102 (for controlling pixels 104-1). Each pixel 104-2 in display portion 14-2 may have a corresponding electrode 108 (e.g., anode 108) that is used to control emission of light from that pixel. Thin-film transistor circuitry 110 selectively applies signals to each electrode 108 to control emission of light across display portion 14-2.

A flexible printed circuit such as flexible printed circuit 130 may be attached to the edge of silicon substrate 102. The flexible printed circuit may provide signals to DDIC 114 (e.g., from a motherboard in device 10). An additional flexible printed circuit may also be attached to an edge of TFT layer 110 and substrate 112. Display driver circuitry for operating display portion 14-2 may be included at the edge of display portion 14-2, and the additional flexible printed circuit may provide signals to the display driver circuitry.

As shown in FIG. 7, the width and pitch (center-to-center spacing) of each pixel in display portion 14-1 is smaller than in display portion 14-2. The width and pitch of pixels 104-2 may each be greater than in pixels 104-1 by more than 50%, more than 100%, more than 200%, more than 300%, more than 500%, less than 500%, between 300% and 800%, etc. Display portion 14-1 therefore has a higher resolution than display portion 14-2 (as discussed in connection with FIG. 3). The resolution in display portion 14-1 may be greater than the resolution in display portion 14-2 by more than 50%, more than 100%, more than 200%, more than 300%, more than 500%, less than 500%, between 300% and 800%, etc.

Display portions 14-1 and 14-2 may be formed separately and subsequently attached (e.g., by one or more attachment structures 132). The attachment structures may be formed from adhesive, solder, or any other desired material. TFT layer 110 is omitted from substrate 112 over display portion 14-1. In this way, substrate 112 forms a transparent window that allows light from display portion 14-1 to pass through substrate 112 to a viewer. In the transparent window region of display portion 14-2, one or more components (e.g., thin-film transistors) is omitted that is included in the light-emitting portion of display portion 14-2. Each pixel 104-2 may be controlled by one or more TFTs. These TFTs may be omitted over display portion 14-1 to maximize the transparency over display portion 14-1.

There are several advantages to the arrangement of FIG. 7. Display portion 14-1 may be as large as possible given manufacturing constraints for silicon substrate 102 and its corresponding pixels. Display portion 14-2 may have a low cost to manufacture and still provides satisfactory display performance for the periphery of the user's vision. The transparent window of display portion 14-2 allows for mitigation of a visible seam between display portions 14-1 and 14-2 (when viewed from above in the negative Z-direction).

To manufacture a display of the type shown in FIG. 7, thin-film transistor circuitry 110 and OLED layer(s) 116-2 may be formed on transparent substrate 112. Some or all of these layers may be omitted in a transparent window portion of display portion 14-2. Separately, silicon substrate 102 may be formed and OLED layers 116-1 may be formed on the silicon substrate. Silicon substrate 102 may then be attached to glass substrate 112 by attachment structures 132 such that display portion 14-1 emits light through the transparent window in display portion 14-2.

Figure 8:
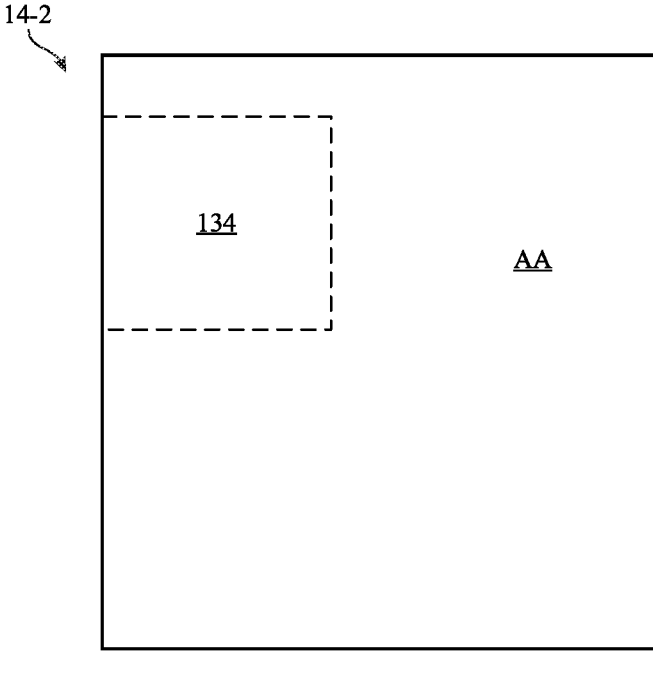
FIG. 8 is a top view of an illustrative display portion with a transparent window that allows transmission of light from an underlying additional display portion in accordance with some embodiments.

FIG. 8 is a top view of display portion 14-2 from FIG. 7. As shown, display portion 14-2 has a light-emitting active area AA and a transparent window 134. Transparent window 134 overlaps the light-emitting area of the underlying display portion 14-1. The pixels in the active area of display portion 14-2 have a lower resolution than the pixels in the active area of display portion 14-1. Transparent window 134 of display portion 14-2 has a greater overall transparency than the active area AA of display portion 14-2. This may also be true in the aforementioned arrangement of FIG. 4.

The example in FIG. 7 of hybrid display 14 including a bottom-emission OLED display portion with a TFT backplane that is stacked with a top-emission OLED display portion with a silicon backplane is merely illustrative. In general, any desired display portions of different technologies, different emission directions, different backplane types, and/or different resolutions may be stacked to form a hybrid display with multiple display portions. In another specific example, a top-emission OLED display portion with a TFT backplane may be stacked with a top-emission OLED display portion with a silicon backplane. As yet another specific example, display portion 14-2 may be formed by a liquid crystal display. The liquid crystal display may have omitted components over display portion 14-1 to form a transparent window. Alternatively, the liquid crystal display may be placed in its transparent state in portions that overlap display portion 14-1 to form a transparent window. As yet another specific example, display portion 14-2 may be formed using discrete inorganic light-emitting diodes (sometimes referred to as microLEDs). Pixels 104-2 may include light-emitting diodes of different colors (e.g., red, green, bluePixel arrangements of other colors may be used, if desired (e.g., four color arrangements, arrangements that include white pixels, three-pixel configurations with pixels other than red, green, and blue pixels, etc.). To produce different colors, the light-emitting diodes of pixels 104-2 may be constructed from different materials systems (e.g., AlGaAs for red diodes, GaN multiple quantum well diodes with different quantum well configurations for green and blue diodes, respectively), may be formed using different phosphorescent materials or different quantum dot materials to produce red, blue, and/or green luminescence, or may be formed using other techniques or combinations of these techniques.

Figure 9:
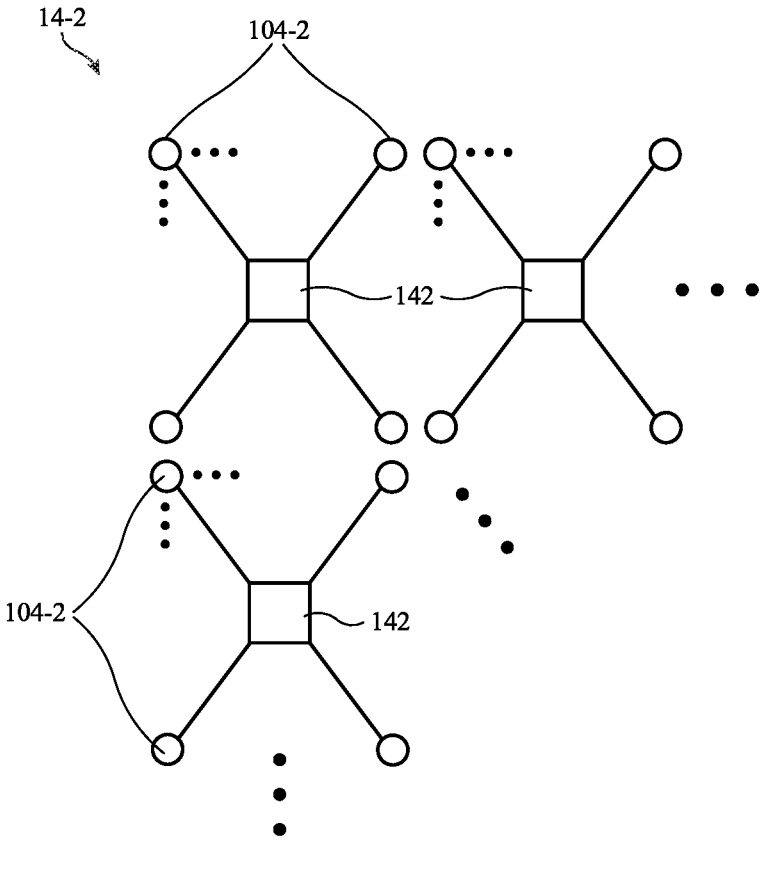
FIG. 9 is a schematic diagram of an illustrative display with pixel control circuits in accordance with some embodiments.

In another possible arrangement, display portion 14-2 may include a plurality of pixel control circuits that are used to control pixels 104-2. FIG. 9 is a schematic diagram of an illustrative display portion with pixel control circuits. As shown, sets of one or more pixels 104-2 may be controlled using respective pixel control circuits 142 (sometimes referred to as driving circuits 142 or microdrivers 142). Pixel control circuits 142 may be formed using integrated circuits (e.g., silicon integrated circuits) and/or thin-film transistor circuitry. The thin-film transistor circuitry may include thin-film transistors formed from silicon (e.g., polysilicon thin-film transistors or amorphous silicon transistors) and/or may include thin-film transistors based on semiconducting oxides (e.g., indium gallium zinc oxide transistors or other semiconducting oxide thin-film transistors). Configurations for display portion 14-2 in which pixel control circuits 142 are each formed from a silicon integrated circuit may be used if desired. Alternatively, pixel control circuits 142 may be integrated into silicon substrate 102 for display portion 14-1.

In one possible arrangement, pixels 104-2 may be organized in an array (e.g., an array having rows and columns). Pixel control circuits 142 may be organized in an associated array (e.g., an array having rows and columns). In this case, pixel control circuits 142 are formed separately from silicon substrate 102 for display portion 14-1. As shown in FIG. 9, pixel control circuits 142 may be interspersed among the array of pixels 104-2.

The pixel control circuits 142 may be coupled to additional display driver circuitry if desired. The display driver circuitry may contain communications circuitry for communicating with system control circuitry. During operation, control circuitry on a logic board (e.g., control circuitry 12 of FIG. 1) may supply the display driver circuitry with information on images to be displayed on display portion 14-2. To display the images on display pixels 104-2, the display driver circuitry may supply corresponding image data, control signals, and/or power supply signals to pixel control circuits 142 over signal lines. Based on the received power, image data, and control signals, the pixel control circuits 142 direct a respective subset of pixels 104-2 to generate light at desired intensity levels.

Signal lines coupled to the pixel control circuits may carry analog and/or digital control signals (e.g., scan signals, emission transistor control signals, clock signals, digital control data, power supply signals, etc.). In some cases, a signal line may be coupled to a respective column of pixel control circuits 142. In some cases, a signal line may be coupled to a respective row of pixel control circuits 142. Each pixel control circuit 142 may be coupled to one or more signal lines. Display driver circuitry that provides signals to the pixel control circuits may be formed on the upper edge of display portion 14-2, on the lower edge of display portion 14-2, on the upper and left edges of display portion 14-2, on the upper, left, and right edges of display portion 14-2, or any other desired location(s) within display portion 14-2.

Pixels 104-2 may be organic light-emitting diode pixels or liquid crystal display pixels. Alternatively, pixels 104-2 may be formed from discrete inorganic light-emitting diodes (sometimes referred to as microLEDs). Pixels 104-2 may include light-emitting diodes of different colors (e.g., red, green, blue). Corresponding signal lines may be used to carry red, green, and blue data. Pixel arrangements of other colors may be used, if desired (e.g., four color arrangements, arrangements that include white pixels, three-pixel configurations with pixels other than red, green, and blue pixels, etc.). To produce different colors, the light-emitting diodes of pixels 104-2 may be constructed from different materials systems (e.g., AlGaAs for red diodes, GaN multiple quantum well diodes with different quantum well configurations for green and blue diodes, respectively), may be formed using different phosphorescent materials or different quantum dot materials to produce red, blue, and/or green luminescence, or may be formed using other techniques or combinations of these techniques. The light-emitting diodes may have thicknesses between 0.5 and 10 microns and may have lateral dimensions between 2 microns and 100 microns (as examples). Light-emitting diodes with other thicknesses (e.g., below 2 microns, above 2 microns, etc.) and that have other lateral dimensions (e.g., below 10 microns, below 20 microns, above 3 microns, above 15 microns, etc.) may also be used, if desired.

As one example, each pixel control circuit 142 may control a respective local passive matrix of LED pixels 104-2. In a local passive matrix of LED pixels, the LEDs of each column in the passive matrix may be connected to a common anode contact whereas the LEDs of each row in the passive matrix may be connected to a common cathode contact. Pixel control circuit 142 may control the current and voltage provided to each anode contact and cathode contact. In this way, each pixel control circuit 142 controls the current through each light-emitting diode 104-2 of its respective local passive matrix, which controls the intensity of light emitted by each light-emitting diode. During operation of the passive matrix, pixel control circuit 142 may scan the pixels 104-2 row-by-row at high speeds to cause each LED 104-2 to emit light at a desired brightness level. In other words, each pixel in the first row is updated to a desired brightness level, then each pixel in the second row is updated to a desired brightness level, etc.

Figure 10A:
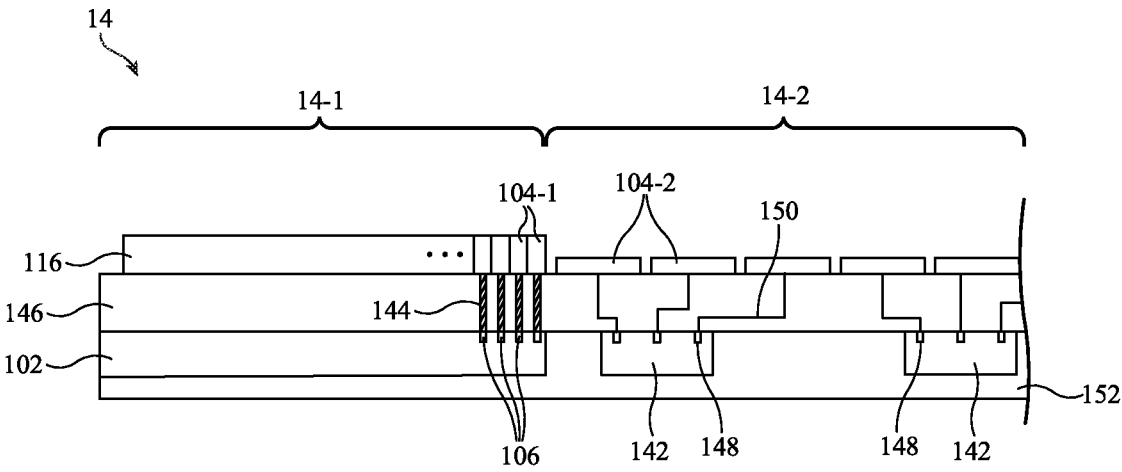
FIG. 10A is a cross-sectional side view of an illustrative hybrid display having a first display portion with pixel control circuits and a second display portion with a silicon backplane formed separately from the pixel control circuits in accordance with some embodiments.

FIG. 10A is a cross-sectional side view of an illustrative hybrid display with a first display portion having a silicon backplane and a second display portion controlled by pixel control circuits. As shown in FIG. 10A, one or more organic light-emitting diode layers 116 are used to form OLED pixels for display portion 14-1. The OLED layers 116 may include a hole transport layer, a hole injection layer, an emissive layer, an electron transport layer, and an electron injection layer. This example is merely illustrative, and common OLED layer(s) 116 may include any desired number and arrangement of layers.

Display portion 14-1 uses a silicon substrate 102 that includes circuitry for operating first display pixels 104-1. Each pixel 104-1 in display portion 14-1 may have a corresponding electrode 106 (e.g., anode 106) that is used to control emission of light from that pixel. Electrodes 106 may sometimes be referred to as contacts 106. Each contact 106 is electrically connected to a respective via 144 through dielectric layer 146. Vias 144 electrically connect contacts 106 to OLED layers 116. Each via 144 may optionally be electrically connected between a contact 106 and another contact/electrode (anode) that is in direct contact with OLED layers 116. Circuitry within silicon substrate 102 selectively applies signals to each electrode 106 to control emission of light across display portion 14-1. A display driver integrated circuit (DDIC) may be mounted on silicon substrate 102 and may provide signals to circuitry within substrate 102 (for controlling pixels 104-1).

Pixel control circuits 142 may be coplanar with silicon substrate 102. Pixel control circuits 142 may be formed by integrated circuits (that include silicon). Pixel control circuits 142 may have output contacts 148 that are used to control emission of light from pixels 104-2 in display portion 14-2. Each contact 148 is electrically connected to one or more redistribution layers 150 (e.g., horizontally extending conductive layers connected by conductive vias) that extend through dielectric layer 146. Redistribution layers 150 electrically connect contacts 148 to pixels 104-2. In this example, pixels 104-2 are microLEDs. Each contact is electrically connected to a respective microLED to control emission of light by that microLED. Each redistribution layer 150 may optionally be electrically connected between a contact 148 and another contact/electrode that is in direct contact with microLEDs 104-2. Circuitry within pixel control circuits 142 selectively applies signals to each contact 148 to control emission of light across display portion 14-2.

A dielectric layer 152 may be included that conforms to silicon substrate 102 and pixel control circuits 142. Portions of dielectric layer 152 are formed between silicon substrate 102 and pixel control circuits 142 to separate the silicon substrate from the pixel control circuits. Different pixel control circuits 142 are also separated by portions of dielectric layer 152.

Figure 10B:
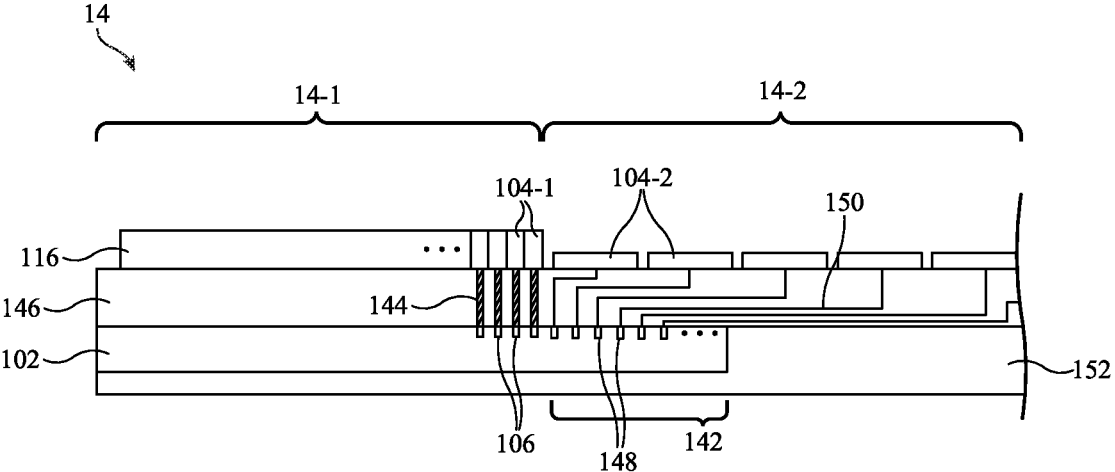
FIG. 10B is a cross-sectional side view of an illustrative hybrid display having a first display portion with pixel control circuits and a second display portion with a silicon backplane formed integrally with the pixel control circuits in accordance with some embodiments.

In another possible arrangement, shown in FIG. 10B, pixel control circuits 142 are integrated into silicon substrate 102. Silicon substrate 102 therefore has a first portion that controls display portion 14-1 (similar to as described above in connection with FIG. 10A). However, silicon substrate 102 also includes integral pixel control circuits 142 that control the pixels 104-2 in display portion 14-2. Silicon substrate 102 includes output contacts 148 that are electrically connected to redistribution layers 150 that fan out signals from the pixel control circuit(s) 142 to the pixels 104-2 in display portion 14-2.

In FIGS. 10A and 10B, the hybrid display includes display portions with pixels formed using different display technologies (e.g., OLED pixels versus microLED pixels) in addition to having different resolutions.

Figure 11:
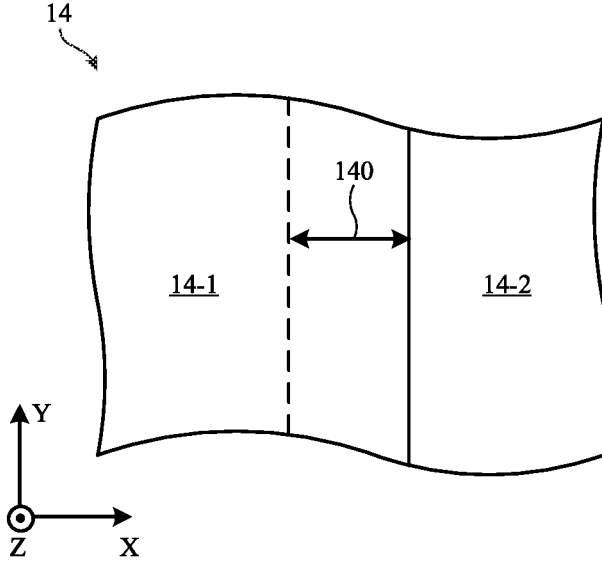
FIG. 11 is a top view of an illustrative hybrid display with overlapping display portions in accordance with some embodiments.

In some of the display arrangements described herein (e.g., in FIG. 7), the display portions are formed in different planes and therefore may possibly overlap. In FIG. 7, the light-emitting area of display portion 14-2 does not overlap the light-emitting area of display portion 14-1 in the Z-direction. This example is, however, merely illustrative. In another possible example, shown in FIG. 11, display portions 14-1 and 14-2 have overlapping light-emitting areas. Display portion 14-1 has a light-emitting area with a border defined by the vertical solid line of FIG. 11. Display portion 14-2 has a light-emitting area with a border defined by the vertical dashed line of FIG. 11. The light-emitting areas (and corresponding pixels) therefore overlap by distance 140. The display portions may be calibrated in tandem to ensure a smooth transition between the high resolution display portion 14-1 and the low resolution display portion 14-2.

Figure 12:
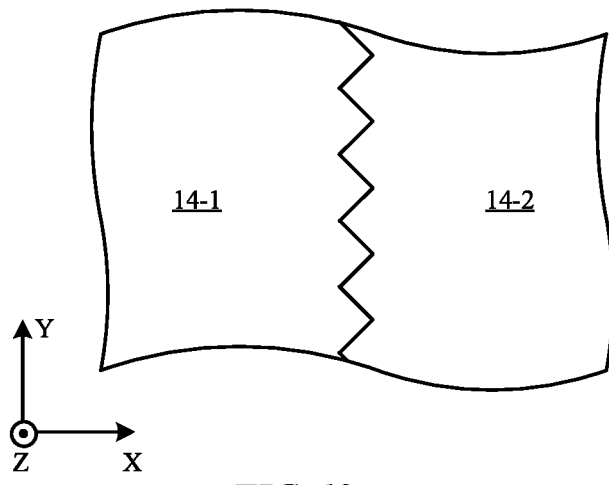
FIG. 12 is a top view of an illustrative hybrid display with a jagged interface between display portions in accordance with some embodiments.

Another option for smoothing the transition between the light-emitting areas of display portions 14-1 and 14-2 is shown in FIG. 12. As shown, the interface between the light-emitting areas of display portions 14-1 and 14-2 has a feathered (jagged) edge such that the relative density of each type of pixel gradually changes between the two portions. When moving in the positive X-direction, the relative density of high resolution pixels from portion 14-1 (e.g., taken in a vertical line parallel to the Y-axis) gradually changes from a maximum magnitude of 100% to a minimum magnitude of 0%. When moving in the negative X-direction, the relative density of low resolution pixels from portion 14-2 (e.g., taken in a vertical line parallel to the Y-axis) gradually changes from a maximum magnitude of 100% to a minimum magnitude of 0%.

Figure 13:
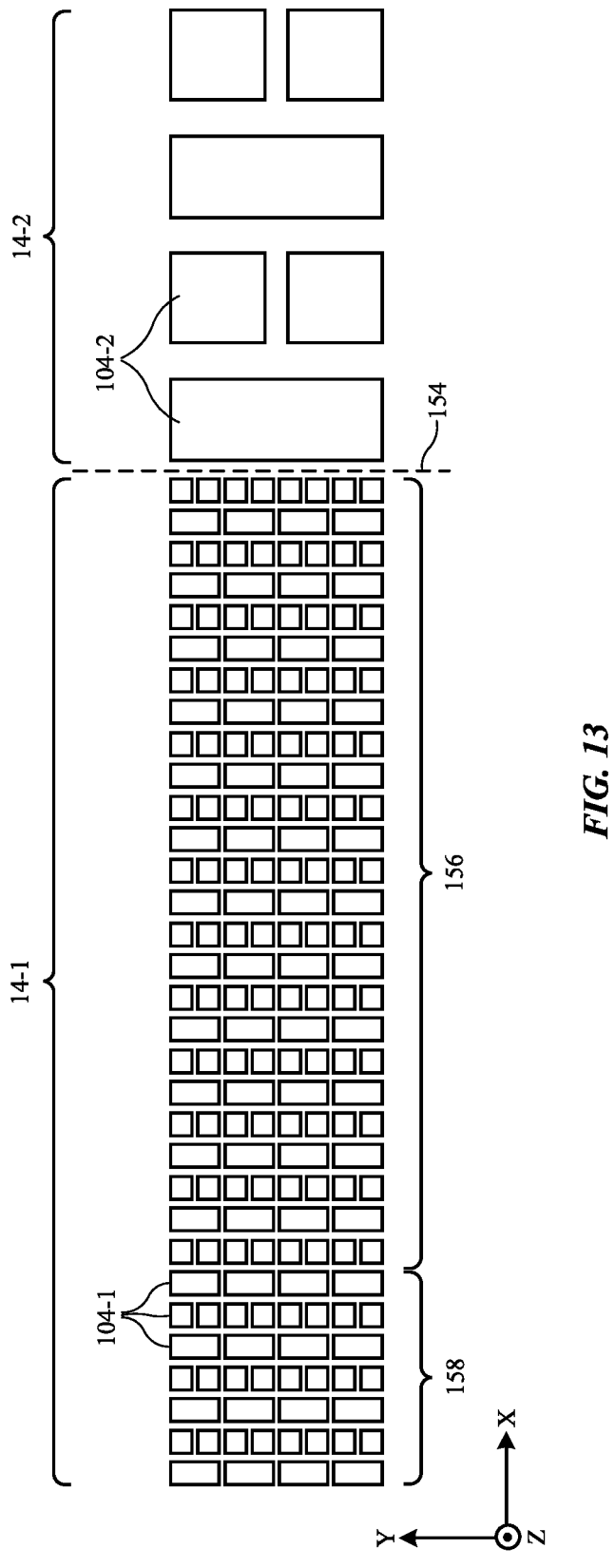
FIG. 13 is a top view of an illustrative hybrid display with a transition region between display portions in accordance with some embodiments.

Yet another option for smoothing the transition between the light-emitting areas of display portions 14-1 and 14-2 is shown in FIG. 13. In the example of FIG. 13, display portion 14-1 has a higher resolution than display portion 14-2. The physical interface between display portions 14-1 and 14-2 is at interface 154. However, display portion 14-1 may include a transition region 156 to smooth the transition between display portions 14-1 and 14-2. In bulk region 158 of display portion 14-1, each pixel 104-1 is controlled individually (e.g., each pixel can emit a different amount of light). In transition region 156, the luminance of some of the pixels may be tied together to better approximate the larger pixels in display portion 14-2. In this way, a visible transition between the light-emitting areas of display portions 14-1 and 14-2 may be avoided or mitigated. The luminance values in transition region 156 may be controlled by software. In other words, the physical arrangement of the pixels in transition region 156 is the same as in region 158. However, the control circuitry that controls the luminance of each pixel in transition region 156 may assign some of the pixels in region 156 the same luminance levels to achieve the desired smoothing. The software smoothing applied in region 156 may be gradual. In other words, the smoothing varies in the X-direction in FIG. 13 (e.g., two adjacent pixels are grouped, then three adjacent pixels are grouped, then four adjacent pixels are grouped, etc.). Alternatively, the software smoothing applied in region 156 may be uniform. In other words, an intermediate smoothing technique is applied uniformly across the entire transition region 156 (e.g., three adjacent pixels are grouped across the entire transition region).

Figure 14:
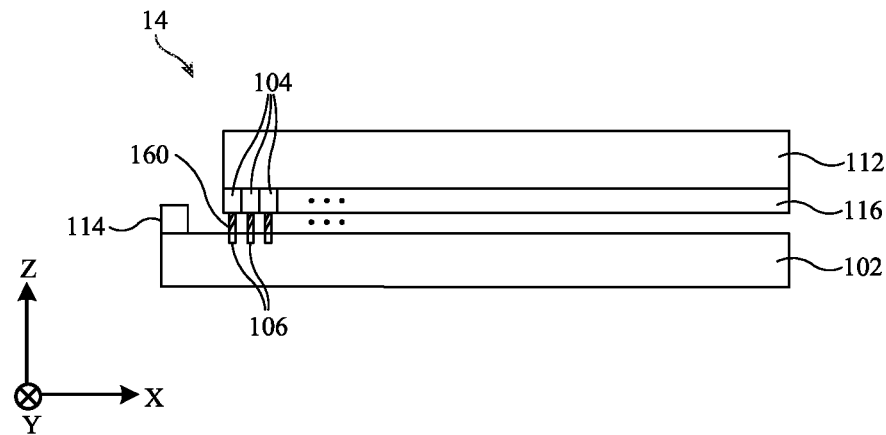
FIG. 14 is a cross-sectional side view of an illustrative display having a bottom-emission organic light-emitting diode frontplane that is attached to a silicon backplane in accordance with some embodiments.
Figure 15:
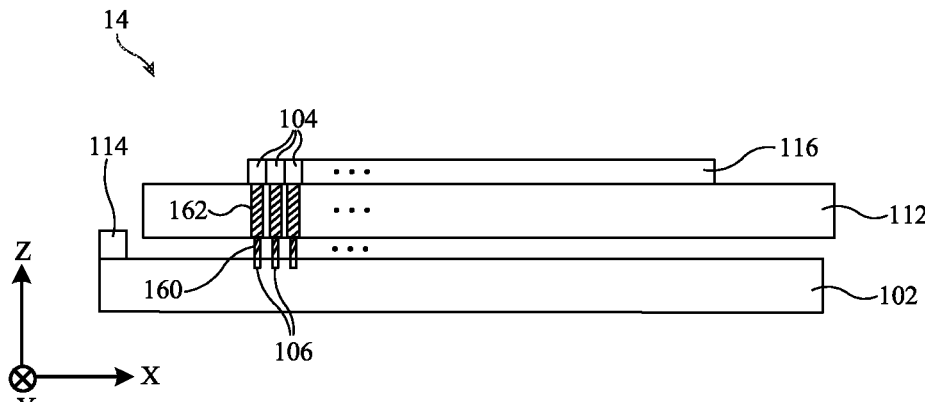
FIG. 15 is a cross-sectional side view of an illustrative display having a top-emission organic light-emitting diode frontplane that is attached to a silicon backplane in accordance with some embodiments.

Examples have been described herein where a hybrid display with different portions having different resolutions is used to increase the field-of-view of a display. Another option to increase the field-of-view of a display is to separately manufacture the display frontplane (e.g., with the light-emitting elements) and display backplane (e.g., with the control circuitry for controlling the light-emitting elements). This technique may allow for some of the display components to be shifted from the backplane to the frontplane, which allows for the size of the light-emitting area of the display (and correspondingly, the field-of-view) to be increased. Additionally, forming the frontplane and backplane separately may allow for separate screening of these components for defects, reducing the manufacturing costs for the display. FIGS. 14 and 15 are cross-sectional side views of displays of this type.

As shown in FIG. 14, one or more organic light-emitting diode layers 116 are used to form OLED pixels 104 for display 14. The OLED layers 116 may include a hole transport layer, a hole injection layer, an emissive layer, an electron transport layer, and an electron injection layer. This example is merely illustrative, and OLED layer(s) 116 may include any desired number and arrangement of layers.

Display 14 uses a dielectric substrate 112 (e.g., a glass substrate or a plastic substrate) for OLED layers 116. Dielectric substrate 112 may be transparent (e.g., having a transparency greater than 90%, greater than 95%, greater than 99%, etc.). During manufacturing, OLED layers 116 are formed on substrate 112. The combination of OLED layers 116 and substrate 112 may be referred to as the display frontplane. In FIG. 14, the display frontplane is a bottom-emission OLED display frontplane (because light is transmitted from pixels 104 in the positive Z-direction through substrate 112).

During manufacturing of display 14, a silicon backplane using silicon substrate 102 may be formed separately from the frontplane. The silicon backplane includes circuitry in silicon substrate 102 that is configured to operate display pixels 104. The backplane has contacts 106 that are configured to output signals to pixels 104.

After the frontplane and the backplane are manufactured (and screened for defects) separately, the frontplane and the backplane may be attached using attachment structures 160. Attachment structures 160 may be formed from conductive material that both electrically and mechanically connect the backplane to the frontplane. As one example, the attachment structures 160 may be formed by conductive (e.g., indium) bumps. Each conductive bump may electrically connect a respective contact 106 to a pixel 104. A display driver integrated circuit (DDIC) 114 may be mounted on silicon substrate 102 and may provide signals to circuitry within substrate 102 (for controlling pixels 104).

In another possible arrangement, shown in FIG. 15, one or more common organic light-emitting diode layers 116 are used to form OLED pixels 104 for a top-emission display. The OLED layers 116 may include a hole transport layer, a hole injection layer, an emissive layer, an electron transport layer, and an electron injection layer. This example is merely illustrative, and OLED layer(s) 116 may include any desired number and arrangement of layers.

Display 14 in FIG. 15 uses a dielectric substrate 112 (e.g., a glass substrate or a plastic substrate) for OLED layers 116. Dielectric substrate 112 may be transparent (e.g., having a transparency greater than 90%, greater than 95%, greater than 99%, etc.). However, because the display is a top-emission display, substrate 112 does not necessarily need to be transparent. Substrate 112 may therefore optionally be opaque. The combination of OLED layers 116 and substrate 112 may be referred to as the display frontplane. In FIG. 15, the display frontplane is a top-emission OLED display frontplane (because light is transmitted from pixels 104 in the positive Z-direction away from substrate 112).

During manufacturing of display 14, a silicon backplane using silicon substrate 102 may be formed separately from the frontplane. The silicon backplane includes circuitry in silicon substrate 102 that is configured to operate display pixels 104. The backplane has contacts 106 that are configured to output signals to pixels 104.

Each contact 106 is electrically connected to a respective via 162 through substrate 112. Vias 162 electrically connect contacts 106 to OLED layers 116. Each via 162 may optionally be electrically connected between a contact 106 and another contact/electrode (anode) that is in direct contact with OLED layers 116. Circuitry within silicon substrate 102 selectively applies signals to each electrode 106 to control emission of light across display 14.

After the frontplane and the backplane are manufactured (and screened for defects) separately, the frontplane and the backplane may be attached using attachment structures 160. Attachment structures 160 may be formed from conductive material that both electrically and mechanically connect the backplane to the frontplane. As one example, the attachment structures 160 may be formed by indium bumps. Each indium bump may electrically connect a respective contact 106 to a pixel 104 (through a respective via 162). A display driver integrated circuit (DDIC) 114 may be mounted on silicon substrate 102 and may provide signals to circuitry within substrate 102 (for controlling pixels 104). Vias 162 may be formed in substrate 112 using laser etching, as one example.

Figure 16:
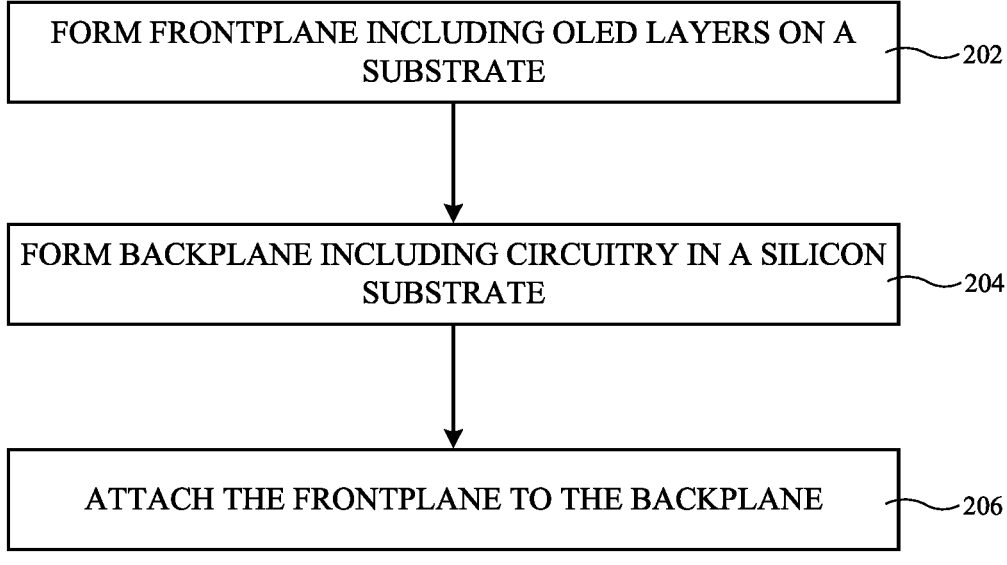
FIG. 16 is a flowchart of illustrative method steps for forming a display in accordance with some embodiments.

FIG. 16 is a flowchart of illustrative method steps for forming a display of the type shown in FIG. 14 or FIG. 15. First, at step 202, a frontplane may be formed. The frontplane may include OLED layers on a substrate. In one example (as in FIG. 14), the frontplane may be a bottom-emission OLED frontplane with OLED layers on a transparent substrate. In another example (as in FIG. 15), the frontplane may be a top-emission OLED frontplane with OLED layers on a substrate that has vias. These examples are merely illustrative. The frontplane may alternatively include microLED pixels, LCD pixels, or any other desired type of pixels. At step 204, a backplane may be formed. The backplane may include circuitry for controlling display pixels in a silicon substrate (i.e., a silicon backplane). Finally, at step 206, the frontplane from step 202 and the backplane from step 204 may be attached using conductive structures. The conductive structures may electrically and physically attach the backplane to the frontplane. The example of the order of the steps depicted in FIG. 16 is merely illustrative, and the order of the steps may be changed if desired (e.g., steps 202 and 204 may be reversed or completed in parallel if desired).

Figure 17:
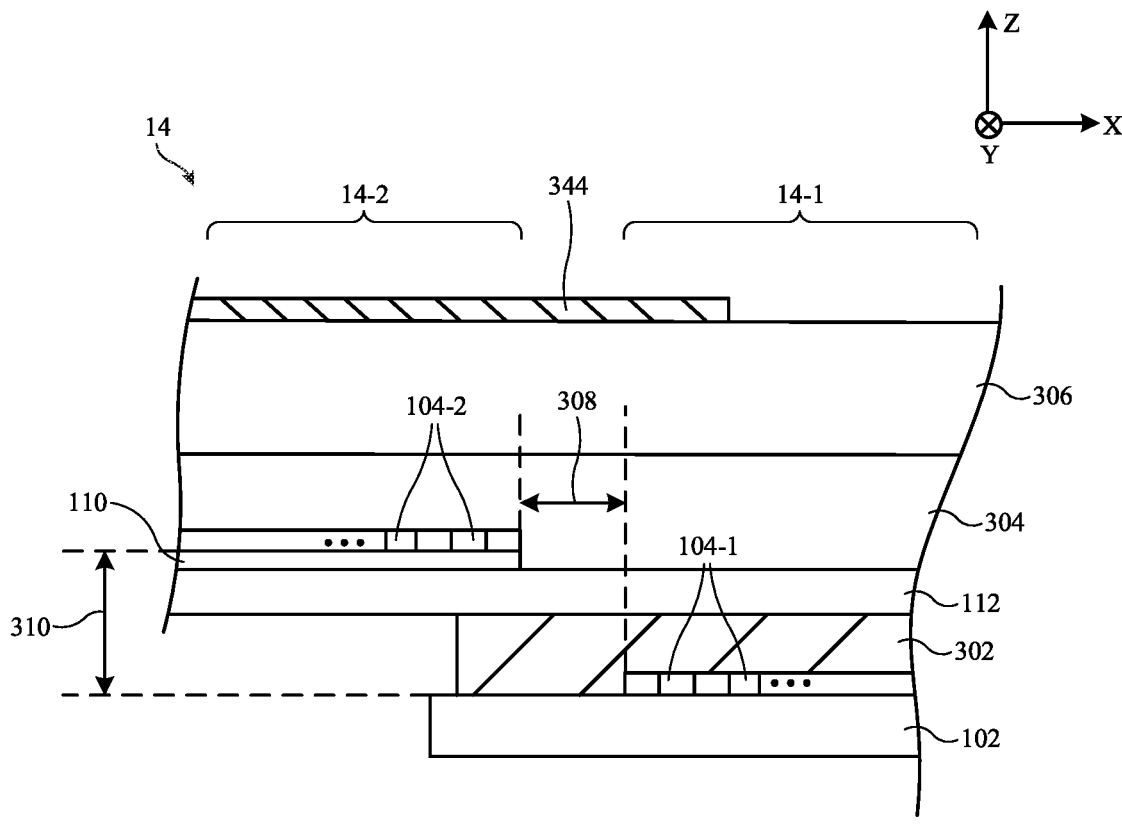
FIG. 17 is a cross-sectional side view of an illustrative hybrid display having a top-emission display portion with a silicon backplane and an additional top-emission display portion with a TFT backplane in accordance with some embodiments.

FIG. 17 is a cross-sectional side view of an illustrative hybrid display having a top-emission display portion with a silicon backplane and an additional top-emission display portion with a TFT backplane in accordance with an embodiment. As shown in FIG. 17, the hybrid display includes a first display portion 14-1 with a silicon backplane and a second display portion 14-2 with a TFT backplane. One or more organic light-emitting diode layers may be used to form pixels 104-2 for portion 14-2. Pixels 104-1 may be microLED pixels or another desired type of pixels.

Display portion 14-1 uses a silicon substrate 102 that includes circuitry for operating first display pixels 104-1.

Display portion 14-2 uses a dielectric substrate 112 (e.g., a glass substrate or a plastic substrate). Dielectric substrate 112 may be transparent (e.g., having a transparency greater than 80%, greater than 90%, greater than 95%, greater than 99%, etc.). In one example, substrate 112 may be formed from polyimide and may sometimes be referred to as colorless polyimide (CPI). A thin-film transistor layer 110 that includes thin-film transistors is included on substrate 112 and is used to operate display pixels 104-2 for display portion 14-2. Display portion 14-2 is a top-emission OLED display where light is emitted away from substrate 112 in the positive Z-direction. Display portion 14-1 is a top-emission microLED display where light is emitted away from substrate 102 and through substrate 112 in the positive Z-direction.

As shown in FIG. 17, the width and pitch (center-to-center spacing) of each pixel in display portion 14-1 is smaller than in display portion 14-2. The width and pitch of pixels 104-2 may each be greater than in pixels 104-1 by more than 50%, more than 100%, more than 200%, more than 300%, more than 500%, less than 500%, between 300% and 800%, etc. Display portion 14-1 therefore has a higher resolution than display portion 14-2 (as discussed in connection with FIG. 3). The resolution in display portion 14-1 may be greater than the resolution in display portion 14-2 by more than 50%, more than 100%, more than 200%, more than 300%, more than 500%, less than 500%, between 300% and 800%, etc.

One or more components (e.g., opaque components) of TFT layer 110 is omitted from substrate 112 over display portion 14-1. In this way, substrate 112 forms a transparent window that allows light from display portion 14-1 to pass through substrate 112 (e.g., a transparent window in substrate 112) to a viewer. In the transparent window region of display portion 14-2, one or more components (e.g., thin-film transistors) is omitted that is included in the light-emitting portion of display portion 14-2. Each pixel 104-2 may be controlled by one or more TFTs. These TFTs may be omitted over display portion 14-1 to maximize the transparency over display portion 14-1.

In the display of FIG. 17, adhesive layer 302 (e.g., an optically clear adhesive layer) may be interposed between substrate 102 (with pixels 104-1) and substrate 112. Adhesive layer 302 is therefore used to attach display portion 14-1 to the transparent substrate 112 of display portion 14-2.

An additional transparent protective layer 306 (sometimes referred to as a display cover layer, cover glass, etc.) may be formed over the display portions. Transparent protective layer 306 may be formed from glass, plastic, ceramic, or any other desired material. At least one additional layer such as additional adhesive layer 304 may optionally be interposed between transparent protective layer 306 and display pixels 104-2. Adhesive layer 304 may directly contact a lower surface of display cover layer 306, an upper surface of display pixels 104-2, an upper surface of substrate 112, and/or side surfaces of pixels 104-2 and TFT layer 110. Adhesive layers 304 and 306 may each have a transparency greater than 80%, greater than 90%, greater than 95%, greater than 99%, etc.

With the arrangement of FIG. 17, there may be a first gap 308 in the X-direction (e.g., orthogonal to the direction of emission) between the edges of a first pixel array for display portion 14-2 (e.g., pixels 104-2) and a second pixel array for display portion 14-1 (e.g., pixels 104-1). Gap 308 may sometimes be referred to as a horizontal gap 308. There may also be a second gap 310 in the Z-direction (e.g., parallel to the direction of emission) between a first plane that includes the first pixel array for display portion 14-2 (e.g., pixels 104-2) and a second plane that includes the second pixel array for display portion 14-1 (e.g., pixels 104-1). Gap 310 may sometimes be referred to as a vertical gap 310.

If care is not taken, gaps 308 and 310 may cause visible artifacts for a viewer viewing display 14. In general, steps may be taken during manufacturing to reduce the size of gaps 308 and 310. For example, cathode patterning may be performed on a cathode layer for display portion 14-2 to mitigate the size requirements for gap 308. Instead or in addition, additional components may be included in display 14 to mitigate visible artifacts caused by gaps 308 and 310.

FIG. 17 shows one such example where a diffusive layer 344 (sometimes referred to as diffuser 344) is incorporated over pixels 104-2 and gap 308. The diffusive layer may mitigate screen door effect (a mesh-like appearance due to visible gaps between pixels) in pixels 104-2. The diffusive layer may also mitigate visible artifacts caused by horizontal gap 308. As shown in FIG. 17, the diffusive layer may overlap all of pixels 104-2, all of gap 308, and an edge of the pixel array including pixels 104-1. Having the diffusive layer extend over some of pixels 104-1 may mitigate visible artifacts in display 14.

Figure 18:
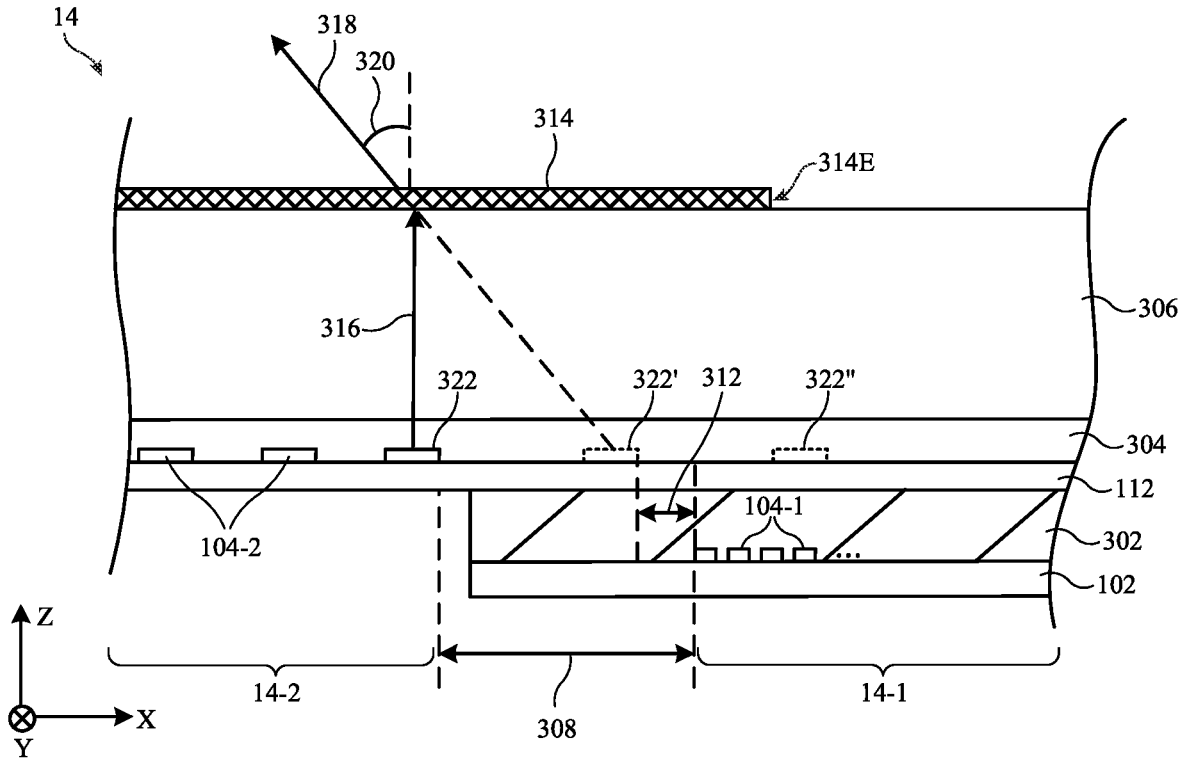
FIG. 18 is a cross-sectional side view of an illustrative hybrid display with a light redirecting layer to mitigate visible artifacts caused by a horizontal gap between the display portions in accordance with some embodiments.

FIG. 18 is a cross-sectional side view of an illustrative display with a light redirecting layer to mitigate a horizontal gap between display portions. The display of FIG. 18 is similar to the display of FIG. 17, and for simplicity common components will not be described again.

To mitigate the front-of-screen impact of horizontal gap 308 between pixels 104-1 and pixels 104-2, the display of FIG. 18 includes a light redirecting structure 314. Consider light that exits a pixel from display portion 14-2 at location 322 and travels in direction 316. The light redirecting structure 314 may redirect this light such that outgoing light travels in direction 318 at an angle 320 relative to the incoming light (and relative to the surface normal of the display). When the light exits the display at an angle (as in FIG. 18), the light appears to originate from an apparent pixel location 322' instead of the physical pixel location 322 for the pixel that emits the light.

In this way, the light redirecting layer shifts the apparent location of the edge of pixels 104-2 away from the actual edge of the pixels 104-2 and towards pixels 104-1. The apparent gap 312 between pixels 104-1 and 104-2 (when the display is viewed through light redirecting structure) may be less than the actual physical gap 308 between pixels 104-1 and 104-2. The apparent location of the edge of pixels 104-2 may be a function of the thickness of display cover layer 306 and the output angle 320 of the light redirecting layer. In general, a greater thickness of display cover layer 306 and a greater output angle 320 cause a greater shift between the actual location 322 of the edge of pixels 104-2 and the apparent location 322' of the edge of pixels 104-2. The thickness of display cover layer 306 and the output angle 320 of the light redirecting layer may be tuned to select a desired location for the apparent location 322' of the edge of pixels 104-2.

In some cases, the apparent location 322' of the edge of pixels 104-2 may be selected such that the width of gap 312 is 0. In other words, the apparent location 322' of the edge of pixels 104-2 is aligned with the edge of pixels 104-1. In some cases, the width of gap 312 may be greater than 0 but less than the width of gap 308. For example, gap 312 may be less than 50 microns, less than 20 microns, less than 10 microns, less than 5 microns, etc. Gap 308, meanwhile, may be greater than 50 microns, greater than 150 microns, greater than 250 microns, etc. In some cases, the apparent location of the edge of pixels 104-2 may be designed to overlap pixels 104-1 in the Z-direction (see, for example, apparent location 322″ in FIG. 18 that overlaps pixels 104-1). Having the apparent location of the edge of pixels 104-2 overlap pixels 104-1 may allow for software blending techniques that mitigate visible artifacts between display portions 14-1 and 14-2.

Light redirecting structures 314 may be formed from a geometric phase grating, hologram grating, prisms, or other desired optical structures. The edge 314E of the light redirecting structures 314 may be aligned with an edge of pixels 104-1, may be separated from the edge of pixels 104-1 by a gap, or may overlap pixels 104-1. In some cases, the light redirecting structures 314 may include a substrate that extends entirely over both display portions 14-1 and 14-2. However, light redirecting functionality (e.g., the presence of gratings) may only (or primarily) be included over display portion 14-2. Over the majority of display portion 14-1, the substrate for the light redirecting structures is simply a transparent layer that does not substantively impact the output of light from display portion 14-1.

Figure 19:
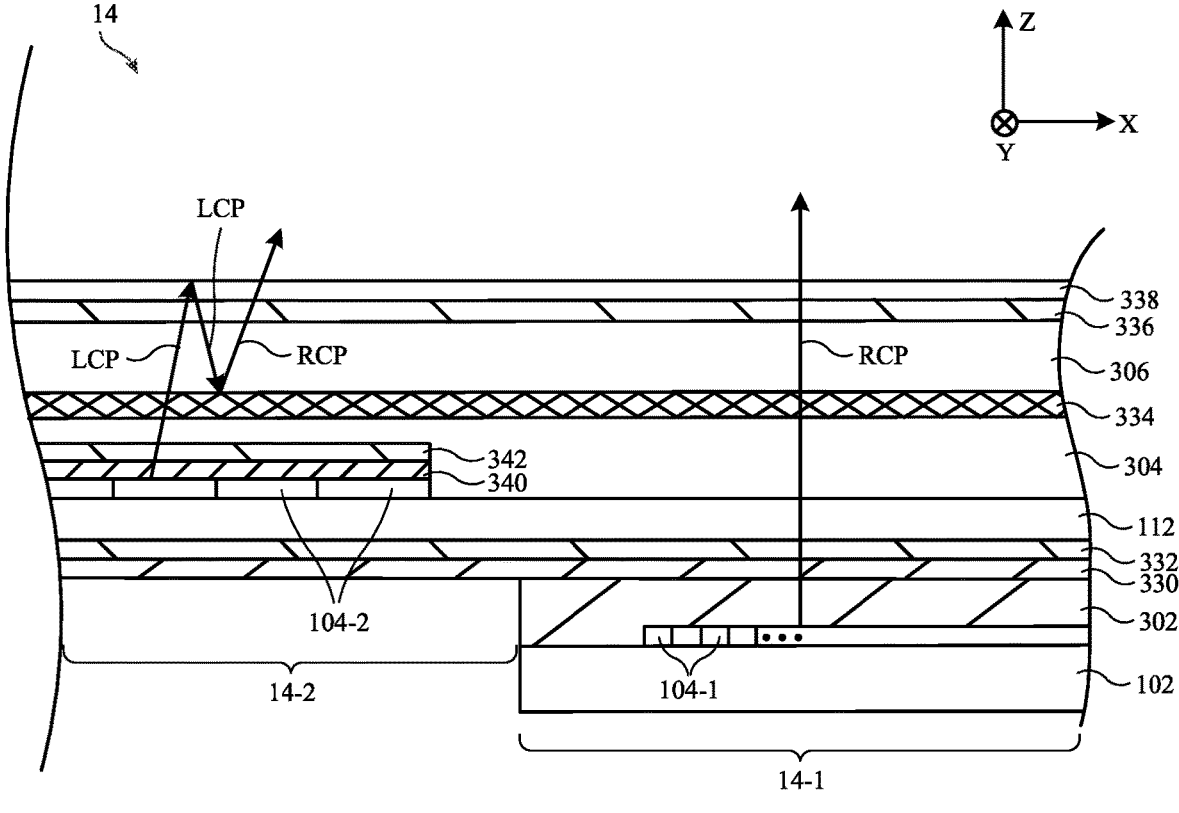
FIG. 19 is a cross-sectional side view of an illustrative hybrid display with optical layers to mitigate visible artifacts caused by a vertical gap between the display portions in accordance with some embodiments.

In FIG. 18, light redirecting structures 314 are included to mitigate visible artifacts caused by a horizontal gap between pixels 104-1 and 104-2. Instead or in addition, optical layers may be included in display 14 to mitigate visible artifacts caused by a vertical gap between pixels 104-1 and 104-2. FIG. 19 is a cross-sectional side view of an illustrative display of this type. The display of FIG. 19 is similar to the display of FIG. 17, and for simplicity common components will not be described again.

As shown in FIG. 19, a linear polarizer 330 and a quarter wave plate 332 may be formed over pixels 104-1 of display portion 14-1. The quarter wave plate 332 may have an optical axis of positive 45 degrees. The linear polarizer 330 and quarter wave plate 332 may collectively form a circular polarizer that outputs righthand circularly polarized (RCP) light.

A circular polarizer may also be formed over display portion 14-2. As shown in FIG. 19, linear polarizer 340 and quarter wave plate 342 are formed over display pixels 104-2. The quarter wave plate 342 may have an optical axis of negative 45 degrees. In other words, quarter wave plate 342 and quarter wave plate 332 have orthogonal optical axes.

The linear polarizer 340 and quarter wave plate 342 collectively form a circular polarizer that outputs lefthand circularly polarized (LCP) light. In other words, display portions 14-1 and 14-2 include respective circular polarizers that output light with opposite circular polarizations.

The display of FIG. 19 also includes a partially reflective mirror 334, a quarter wave plate 336, and a reflective polarizer 338. Partially reflective mirror 334 (sometimes referred to as a partially reflective layer 334 or half-mirror 334) may be a metal mirror coating or other mirror coating such as a dielectric multilayer coating with a 50% transmission and a 50% reflection. Reflective polarizer 338 may have orthogonal reflection and pass axes. Light that is polarized parallel to the reflection axis of reflective polarizer 338 will be reflected by reflective polarizer 338. Light that is polarized perpendicular to the reflection axis and therefore parallel to the pass axis of reflective polarizer 338 will pass through reflective polarizer 338.

LCP light from display pixels 104-2 that passes through partially reflective mirror 334 may pass through quarter wave plate 336 a first time (and is converted to linearly polarized light with a linear polarization that is orthogonal to the pass axis of the reflective polarizer), be reflected off reflective polarizer 338, and then pass through quarter wave plate 336 a second time. The light exits quarter wave plate 336 in the negative Z-direction with a lefthand circular polarization. Some of this light then reflects off partially reflective mirror 334. The reflected light is righthand circularly polarized (RCP). The RCP light travels in the positive Z-direction, passes through quarter wave plate 336 (and is converted to linearly polarized light with a linear polarization that is parallel to the pass axis of the reflective polarizer) and reflective polarizer 338, and is viewable to a viewer.

Including one or more optical layers (e.g., at least partially reflective layers) as in FIG. 19 may increase the path length of the light from pixels 104-2 without impacting the path length of the light from pixels 104-1. The increase in path length for pixels 104-2 may be selected to approximately equal the length of vertical gap 310. In this way, the partially reflective layers mitigate visible artifacts caused by the vertical gap between pixels 104-1 and 104-2.

In FIG. 19, adhesive layer 302 is formed in direct contact with substrate 102, pixels 104-1, and linear polarizer 330. Adhesive layer 304 is formed in direct contact with substrate 112, an upper surface of quarter wave plate 342, side surfaces of quarter wave plate 342, side surfaces of linear polarizer 340, side surfaces of display pixels 104-2, and a lower surface of partially reflective mirror 334. Also in FIG. 19, display cover layer 306 is interposed between partially reflective mirror 334 and quarter wave plate 338. These examples are merely illustrative. In general, layers 330 and 332 may be formed at any location in the display that overlaps pixels 104-1 but not pixels 104-2. Layers 340 and 342 may be formed at any location in the display that overlaps pixels 104-2 but not pixels 104-1. Layer 334 may be formed at any location in the display that overlaps layers 330, 332, 340, and 342. Layers 336 and 338 may be formed at any location in the display that overlaps layer 334. In general, any desired intervening layers may be included between layers 330, 332, 334, 336, 338, 340, and 342 (e.g., solid layers such as display cover layer 306 or adhesive layers, air gaps, etc.).

FIG. 19 shows an example where layers 334, 336, and 338 are formed over both display portions 14-1 and 14-2. This example is merely illustrative. In an alternate arrangement, layers 334, 336, and 338 may be patterned to cover display pixels 104-2 but not display pixels 104-1. Layers 330 and 332 may be omitted from the display in this arrangement if desired. This type of arrangement may increase the efficiency of display portion 14-1.

In FIGS. 17-19, display portion 14-2 is a top-emission OLED display portion. This example is merely illustrative and display portion 14-2 may be a bottom-emission OLED display portion if desired. In general, each display portion may be either a top-emission or bottom-emission display portion.

Figure 20:
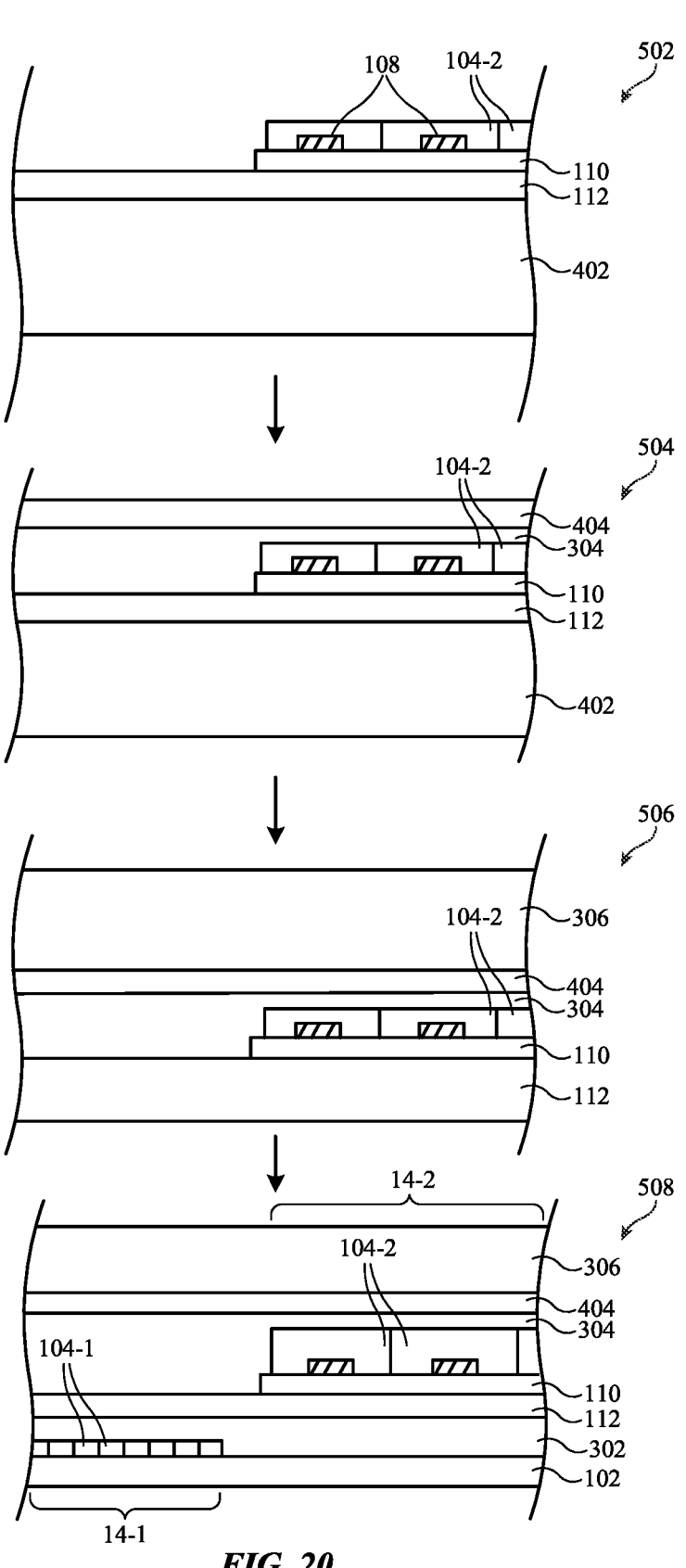
FIG. 20 is a flowchart of illustrative method steps for forming a display using adhesive between first and second display portions in accordance with some embodiments.

FIG. 20 is a flowchart showing a method of manufacturing a display of the type shown in FIG. 17. A cross-sectional side view of the display is shown for each step in FIG. 20. At step 502, thin-film transistor circuitry 110 and pixels 104-2 (each with a corresponding electrode 108 that is used to control emission of light from that pixel) are formed over substrate 112. As discussed in connection with FIG. 17, substrate 112 may be a transparent dielectric substrate such as colorless polyimide. Substrate 112 is attached to a mother glass layer 402 (sometimes referred to as a wafer substrate 402 or substrate 402). Mother glass layer 402 may be formed from glass or another desired material. The mother glass layer may be used during some manufacturing steps before ultimately being removed from the finished display.

Next, at step 504, an adhesive layer 304 and protective layer 404 may be formed over pixels 104-2. Each one of layers 304 and 404 may have a high transparency (e.g., greater than 80%, greater than 90%, greater than 95%, greater than 99%, etc.). The protective layer 404 may protect the underlying display pixels 104-2 during subsequent manufacturing steps.

Steps 502 and 504 may be performed on a wafer that includes a plurality of dies. Each die may include a respective array of pixels 104-2 on substrate 112. Between steps 504 and 506, singulation may be performed to separate the wafer into respective dies.

At step 506, the mother glass 402 may be removed and a display cover layer 306 may be added to the die. An additional adhesive layer may be formed between protective layer 404 and display cover layer 306 if desired. Protective layer 404 may be removed before adding display cover layer 306 if desired.

At step 508, display portion 14-1 with pixels 104-1 on a substrate 102 (e.g., a silicon substrate) may be attached to a lower surface of substrate 112 using adhesive 302. After step 508, the completed display includes a first display portion 14-1 with pixels 104-1 having a higher resolution than a second, adjacent display portion 14-2 with pixels 104-2. Pixels 104-1 may emit light through a transparent window in substrate 112.

In FIG. 20, display portion 14-2 is a top-emission OLED display portion. This example is merely illustrative and display portion 14-2 may be a bottom-emission OLED display portion if desired. In general, each display portion may be either a top-emission or bottom-emission display portion.

Figure 21:
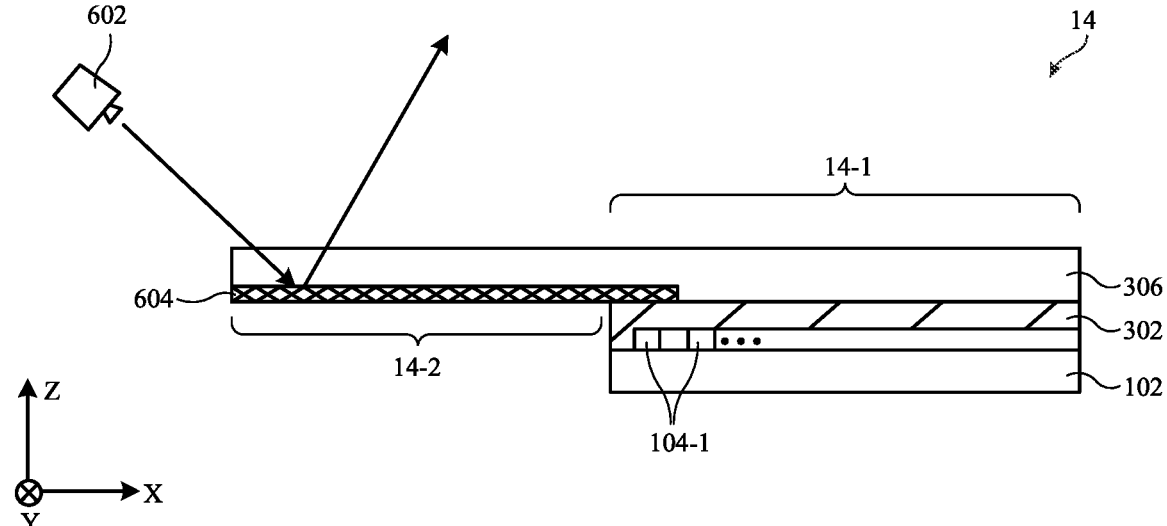
FIG. 21 is a cross-sectional side view of an illustrative hybrid display having a top-emission display portion with a silicon backplane and projector display portion in accordance with some embodiments.

FIG. 21 is a cross-sectional side view of a hybrid display with a projection display portion. As shown in FIG. 21, the first display portion 14-1 has a similar arrangement as in FIG. 17, with pixels 104-1 formed on a substrate 102 (e.g., a silicon substrate 102 that includes circuitry for operating first display pixels 104-1). In FIG. 21, adhesive layer 302 may attach substrate 102 and display pixels 104-1 directly to display cover layer 306.

The second display portion 14-2 in FIG. 21 is a projection display that includes a projector 602. Any desired type of projector may be used. The projector 602 projects light (e.g., a pixelated image) towards a scattering surface 604 on display cover layer 306 (e.g., on a lower surface of display cover layer 306). Scattering surface 604 may redirect the light in the positive Z-direction towards a viewer.

Scattering surface 604 may be formed by nano-structured glass. For example, a lower surface of display cover layer 306 may be patterned with the nano-structures. Alternatively, a scattering film may be laminated to display cover layer 306 (e.g., a lower surface of the display cover layer).

The scattering surface 604 may have a gradient of optical scattering power to blend the two display portions with mitigated visible artifacts. In other words, the optical scattering power may gradually be reduced in the positive X-direction in FIG. 21. As shown in FIG. 21, the scattering surface 604 may overlap pixels 104-1 in the Z-direction, if desired.

Any of the displays described herein may be used in display module 70 shown in FIG. 2 (e.g., the left and/or right display module of a head-mounted device). It is further noted that any of the display portions described herein may optionally be curved instead of planar.

The foregoing is merely illustrative and various modifications can be made to the described embodiments. The foregoing embodiments may be implemented individually or in any combination.

What is claimed is:

1. An electronic device, comprising:
an organic light-emitting diode display portion comprising a first array of pixels on a dielectric substrate;
a light-emitting diode display portion comprising a second array of pixels on a silicon substrate;
an adhesive layer that attaches the organic light-emitting diode display portion to the light-emitting diode display portion, wherein the second array of pixels has a higher resolution than the first array of pixels, and wherein the second array of pixels emits light through the dielectric substrate; and
a diffuser that overlaps at least the first array of pixels.

2. The electronic device defined in claim 1, wherein the second array of pixels comprises microLED pixels.

3. The electronic device defined in claim 1, wherein the dielectric substrate comprises colorless polyimide.

4. The electronic device defined in claim 1, wherein the adhesive layer is an optically clear adhesive layer.

5. The electronic device defined in claim 1, wherein the organic light-emitting diode display portion is a top-emission organic light-emitting diode display portion and wherein the light-emitting diode display portion is a top-emission light-emitting diode display portion.

6. The electronic device defined in claim 1, wherein the organic light-emitting diode display portion is a bottom-emission organic light-emitting diode display portion and wherein the light-emitting diode display portion is a top-emission light-emitting diode display portion.

7. The electronic device defined in claim 1, further comprising:
a display cover layer formed over the organic light-emitting diode display portion and the light-emitting diode display portion; and
a light redirecting layer formed over the display cover layer.

8. The electronic device defined in claim 7, wherein the light redirecting layer causes an apparent edge of the first array of pixels to be shifted away from an actual edge of the first array of pixels and towards the second array of pixels.

9. The electronic device defined in claim 7, wherein the light redirecting layer overlaps at least the first array of pixels.

10. The electronic device defined in claim 9, wherein the light redirecting layer overlaps some but not all of the second array of pixels.

11. The electronic device defined in claim 1, further comprising:
a first circular polarizer formed over the first array of pixels, wherein light from the first array of pixels exits the first circular polarizer with a first circular polarization; and
a second circular polarizer formed over the second array of pixels, wherein light from the second array of pixels exits the second circular polarizer with a second circular polarization that is opposite the first circular polarization.

12. The electronic device defined in claim 1, further comprising:
a partially reflective layer that is formed over at least the first array of pixels;
a quarter wave plate that is formed over the partially reflective layer; and a reflective polarizer that is formed over the quarter wave plate.

13. The electronic device defined in claim 1, wherein the diffuser overlaps some but not all of the second array of pixels.

14. The electronic device defined in claim 1, wherein the first and second arrays of pixels emit light in a first direction, wherein there is a first gap between the first and second arrays of pixels in a second direction that is orthogonal to the first direction, and wherein there is a second gap between the first and second arrays of pixels in the first direction.

15. An electronic device, comprising:

a transparent layer;

a first display portion comprising a scattering surface and a projector, wherein the scattering surface is formed on a lower surface of the transparent layer and wherein the projector is configured to project an image onto the scattering surface; and a second display portion with an array of pixels on a silicon substrate, wherein the array of pixels is configured to emit light through the transparent layer.

16. An electronic device, comprising:

an organic light-emitting diode display portion comprising a first array of pixels on a dielectric substrate;

a light-emitting diode display portion comprising a second array of pixels on a silicon substrate, wherein the organic light-emitting diode display portion is attached to the light-emitting diode display portion, wherein the second array of pixels has a higher resolution than the first array of pixels, and wherein the second array of pixels emits second light through the dielectric substrate;

a first circular polarizer formed over the first array of pixels, wherein first light from the first array of pixels exits the first circular polarizer with a first circular polarization; and a second circular polarizer formed over the second array of pixels, wherein the second light from the second array of pixels exits the second circular polarizer with a second circular polarization.

17. The electronic device defined in claim 16, wherein the second circular polarization is opposite the first circular polarization.

18. The electronic device defined in claim 16, wherein the first circular polarizer has a first optical axis and the second circular polarizer has a second optical axis nonparallel to the first optical axis.

19. The electronic device defined in claim 16, further comprising:

an adhesive layer that attaches the organic light-emitting diode display portion to the light-emitting diode display portion.

20. The electronic device defined in claim 16, further comprising:

a partially reflective layer that is formed over at least the first array of pixels;

a quarter wave plate that is formed over the partially reflective layer; and a reflective polarizer that is formed over the quarter wave plate.

* * * * *